United States Patent
Yanagidaira et al.

(10) Patent No.: US 7,652,928 B2
(45) Date of Patent: Jan. 26, 2010

(54) SEMICONDUCTOR MEMORY DEVICE AND CONTROL METHOD OF THE SAME

(75) Inventors: Kosuke Yanagidaira, Kawasaki (JP);
Koichi Fukuda, Yokohama (JP);
Takahiko Hara, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/778,220

(22) Filed: Jul. 16, 2007

(65) Prior Publication Data
US 2008/0205137 A1    Aug. 28, 2008

(30) Foreign Application Priority Data
Jul. 20, 2006  (JP) ............................. 2006-198508

(51) Int. Cl.
*G11C 16/06* (2006.01)
(52) U.S. Cl. ..................... 365/185.23; 365/185.19; 365/185.22; 365/185.2
(58) Field of Classification Search ............ 365/185.23, 365/185.19, 185.03, 185.22, 185.2
See application file for complete search history.

(56) References Cited

U.S. PATENT DOCUMENTS

| 6,016,274 | A | 1/2000 | Itoh | |
|---|---|---|---|---|
| 6,490,201 | B2 * | 12/2002 | Sakamoto | 365/185.22 |
| 6,687,155 | B2 | 2/2004 | Nagasue | |
| 6,728,133 | B2 * | 4/2004 | Shimizu | 365/185.03 |
| 6,937,520 | B2 | 8/2005 | Ono et al. | |
| 6,940,752 | B2 | 9/2005 | Tanaka et al. | |
| 6,954,378 | B2 * | 10/2005 | Tanaka | 365/185.19 |
| 7,230,852 | B2 * | 6/2007 | Mitani et al. | 365/185.18 |
| 2005/0030828 | A1 * | 2/2005 | Tanaka | 365/232 |

FOREIGN PATENT DOCUMENTS

JP    11-176175    7/1999

* cited by examiner

*Primary Examiner*—Thong Q Le
(74) *Attorney, Agent, or Firm*—Oblon, Spivak, McClelland, Maier & Neustadt, L.L.P.

(57) ABSTRACT

A semiconductor memory device includes a memory cell array, a voltage generating circuit, a memory circuit which stores a reference pulse number of an advance-write voltage of the memory cell array and a parameter, and a control circuit which controls, when a pulse number of the advance-write voltage is less than the reference pulse number of the advance-write voltage, the voltage generating circuit in a manner to decrease at least an initial value of a write voltage and a step-up width of the write voltage in accordance with the parameter.

18 Claims, 18 Drawing Sheets

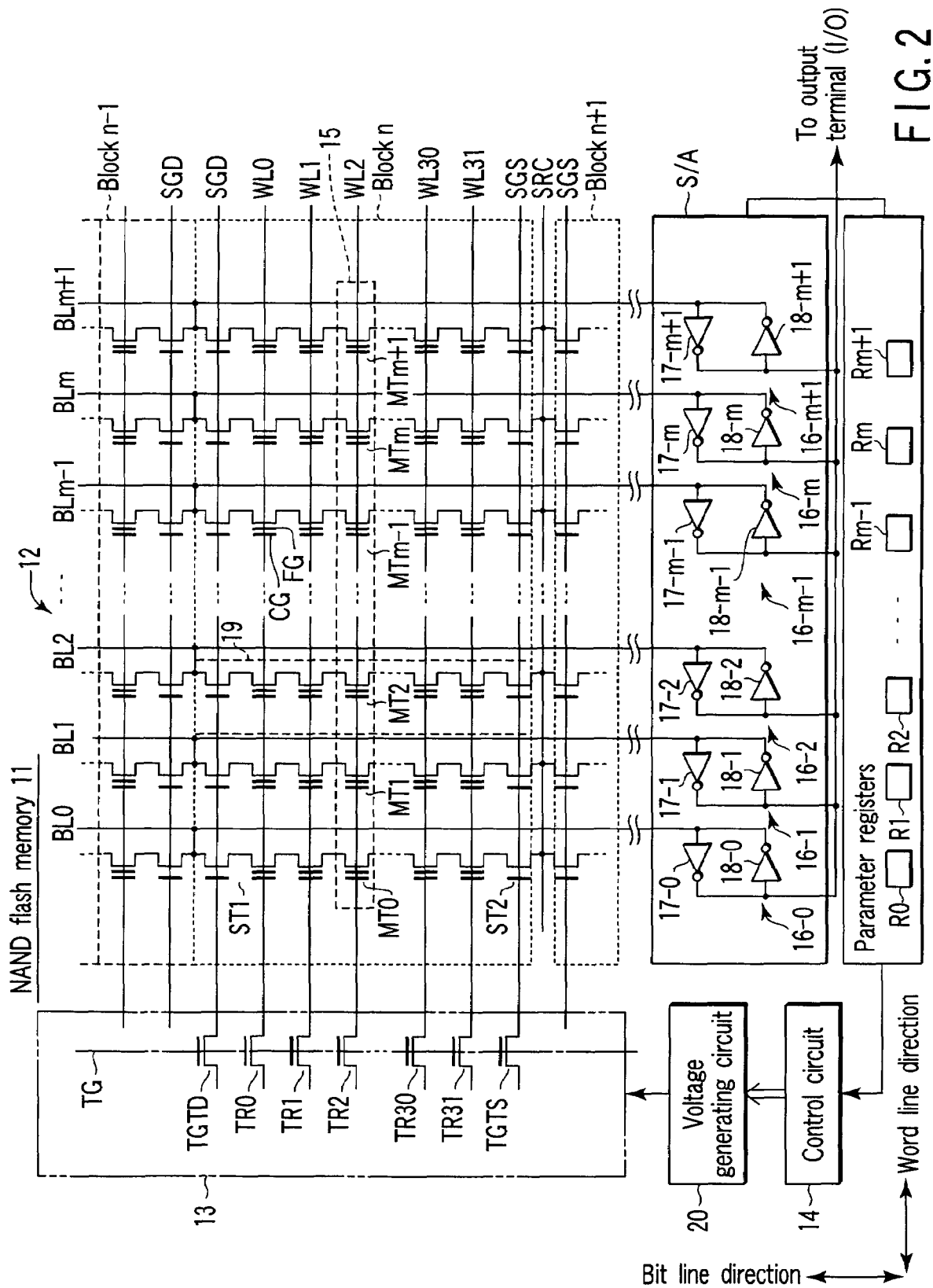
F I G. 2

ST1-1

ST1-2 (acquisition of deterioration information of cell MT)

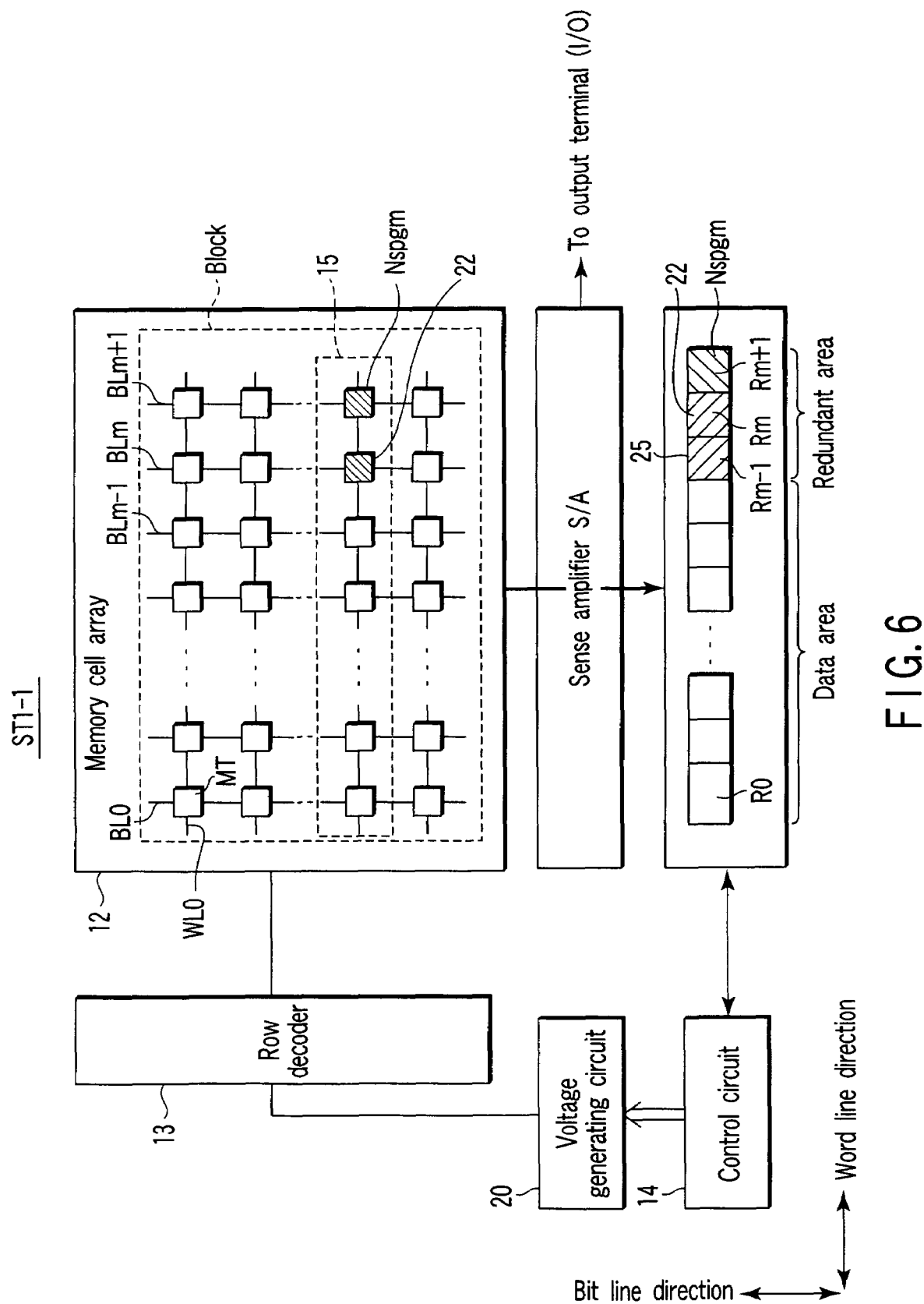
F I G. 6

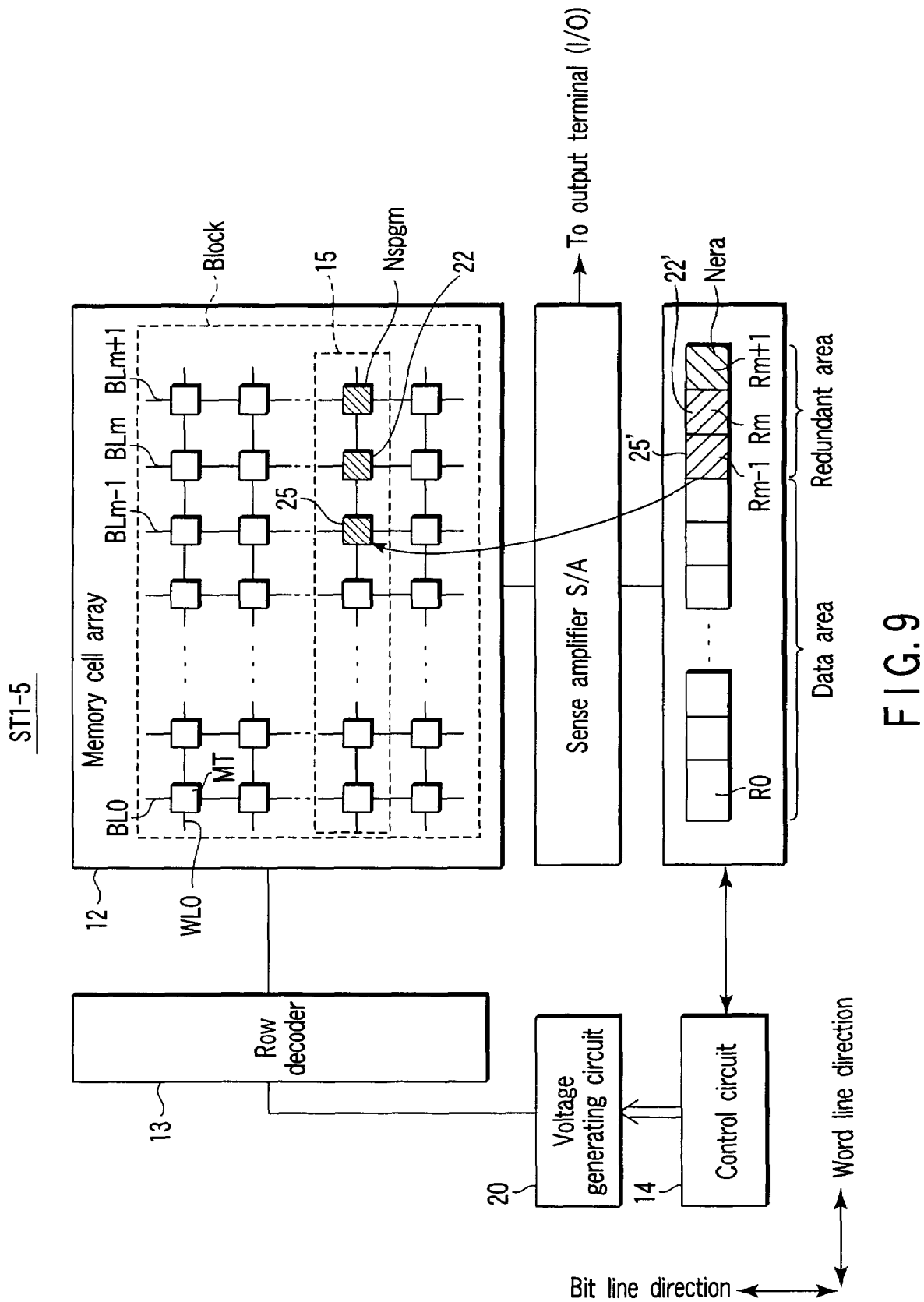
F I G. 9

Cell in initial state

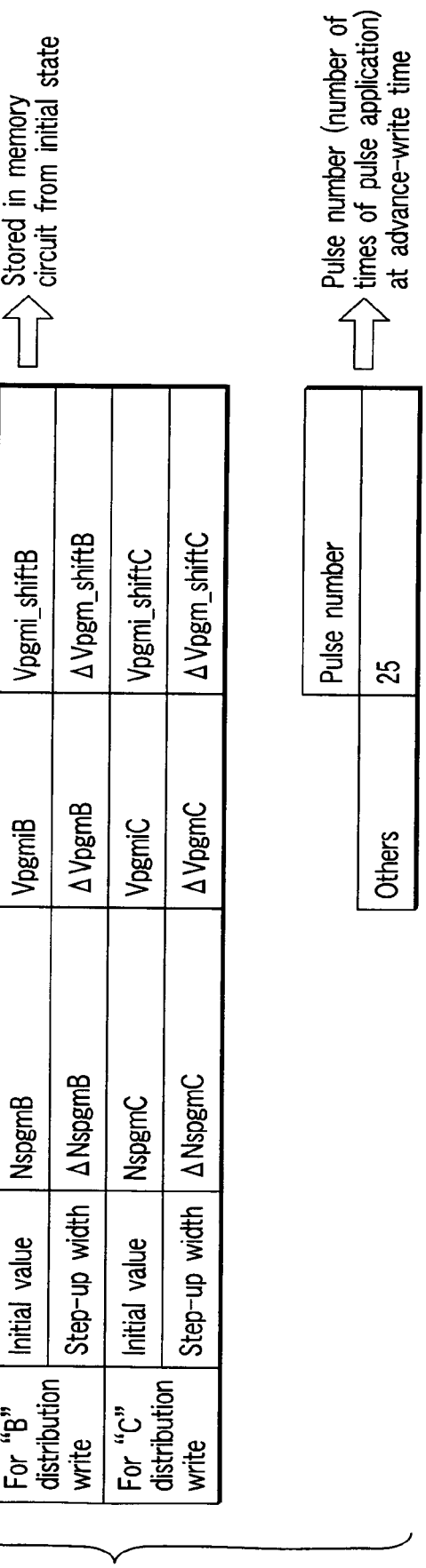
F I G. 20

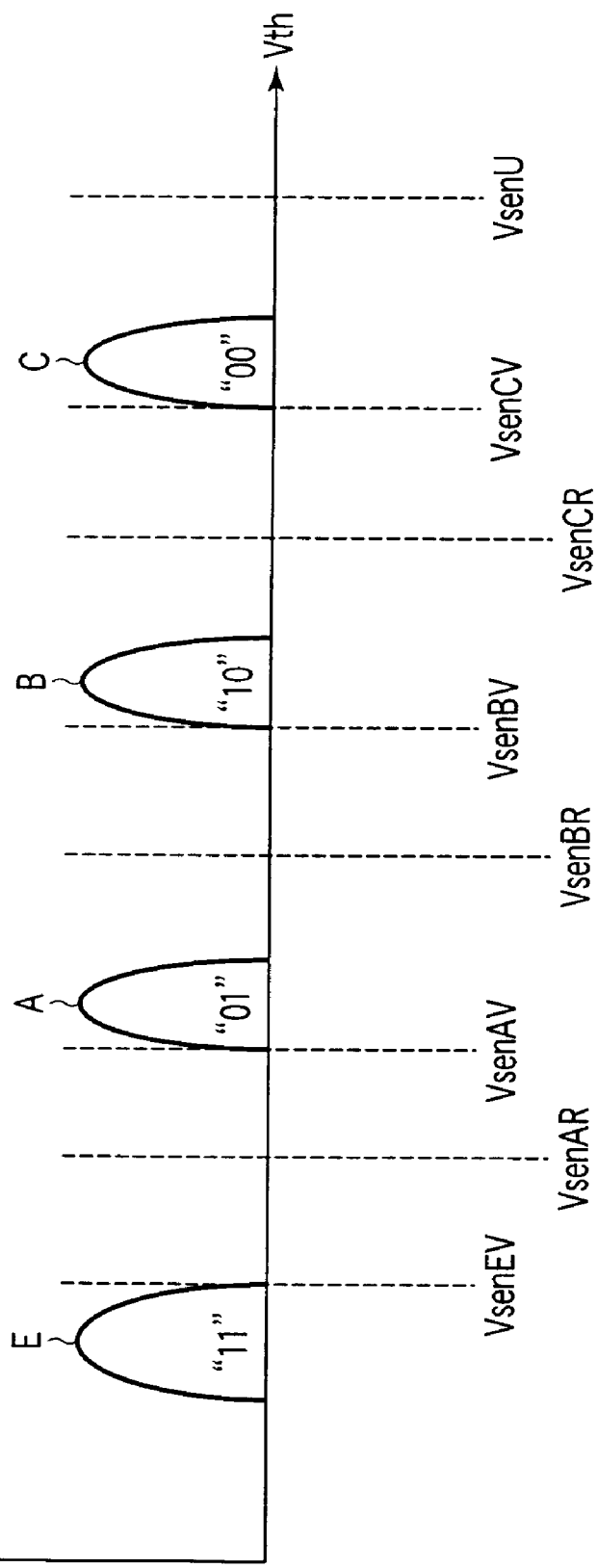
F I G. 21

SEMICONDUCTOR MEMORY DEVICE AND CONTROL METHOD OF THE SAME

CROSS-REFERENCE TO RELATED APPLICATIONS

This application is based upon and claims the benefit of priority from prior Japanese Patent Application No. 2006-198508, filed Jul. 20, 2006, the entire contents of which are incorporated herein by reference.

BACKGROUND OF THE INVENTION

1. Field of the Invention

The present invention relates to a semiconductor memory device and a control method of the semiconductor memory device, which are applied to, for instance, a NAND flash memory.

2. Description of the Related Art

In recent years, a demand for nonvolatile memories has been increasing in accordance with an increase in memory capacity thereof. A NAND flash memory is an example of such nonvolatile memories (see, e.g. Jpn. Pat. Appln. KOKAI Publication No. 11-176175).

When a write operation is executed in the NAND flash memory, for example, a write voltage Vpgm is gradually stepped up from, e.g. a "1" threshold voltage distribution and is applied, and a plurality of pulses are applied until reaching a target "0" threshold voltage distribution. In this case, the initial value α of the write voltage Vpgm and the step-up width ΔVpgm are determined when a diesort test is performed, and are fixed. Thus, after the diesort test, the initial value α of the write voltage Vpgm and the step-up width ΔVpgm are, in principle, invariable.

However, if the number of times of rewrite of write/erase operations increases, the characteristics of a memory cell vary, the write speed increases and the necessary number of pulses decreases. For example, over-program occurs by the first pulse. On the other hand, since the initial value α of the write voltage Vpgm and the step-up width ΔVpgm are fixed, over-program cannot be prevented even if the characteristics of the memory cell vary and the number of pulses decreases.

The memory cell, in which over-program has occurred, becomes a defective element with a write defect.

BRIEF SUMMARY OF THE INVENTION

According to an aspect of the present invention, there is provided a semiconductor memory device comprising: a memory cell array; a voltage generating circuit; a memory circuit which stores a reference pulse number of an advance-write voltage of the memory cell array and a parameter; and a control circuit which controls, when a pulse number of the advance-write voltage that is deterioration information of the memory cell is less than the reference pulse number of the advance-write voltage, the voltage generating circuit in a manner to decrease at least one of an initial value of a write voltage and a step-up width of the write voltage in accordance with the parameters, wherein the control circuit controls the voltage generating circuit by:

writing for obtaining the pulse number of the advance-write voltage;

counting and storing the pulse number; and feeding back the counted pulse number.

According to another aspect of the present invention, there is provided a control method of a semiconductor memory device including a memory cell array, a voltage generating circuit, a memory circuit which stores a reference pulse number of an advance-write voltage of the memory cell array and a parameter, and a control circuit which controls the voltage generating circuit, the method comprising: causing the control circuit to execute an erase operation in the memory cell array; counting a pulse number of pulses of an advance-write voltage which is applied to the memory cell array after the erase operation, thereby detecting deterioration information of the memory cell array; changing, when a write operation is executed in the memory cell array, the parameter in a manner to decrease at least one of an initial value of a write voltage and a step-up width of the write voltage in a case where the counted pulse number of the advance-write voltage that is deterioration information of the memory cell is less than the reference pulse number of the advance-write voltage; and controlling the voltage generating circuit and executing the write operation by using the changed parameter.

BRIEF DESCRIPTION OF THE SEVERAL VIEWS OF THE DRAWING

FIG. 2 is a circuit diagram showing the semiconductor memory device according to the first embodiment;

FIG. 6 is a view for explaining an advance-write operation (ST1-1) according to the first embodiment;

FIG. 9 is a view for explaining the advance-write operation (ST1-5) according to the first embodiment;

FIG. 20 is a view for explaining parameters, etc. which are stored in a memory circuit in the third embodiment;

FIG. 21 shows threshold voltage distributions of the semiconductor memory device according to the third embodiment;

DETAILED DESCRIPTION OF THE INVENTION

Figure 1:
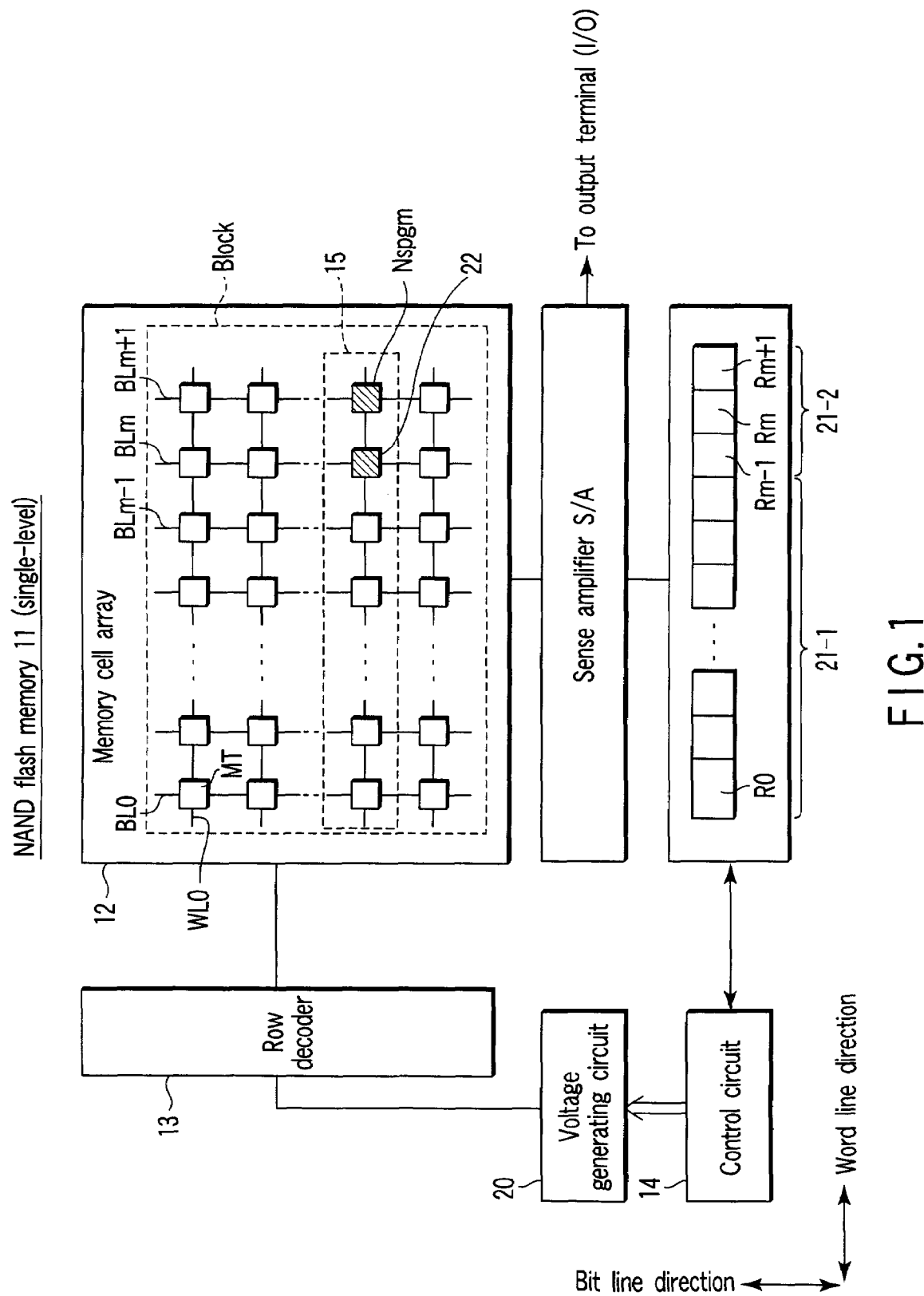
FIG. 1 is a block diagram showing a semiconductor memory device according to a first embodiment of the present invention.

Embodiments of the present invention will now be described with reference to the accompanying drawings. In the description below, common parts are denoted by like reference numerals throughout the drawings.

First Embodiment

Figure 3:
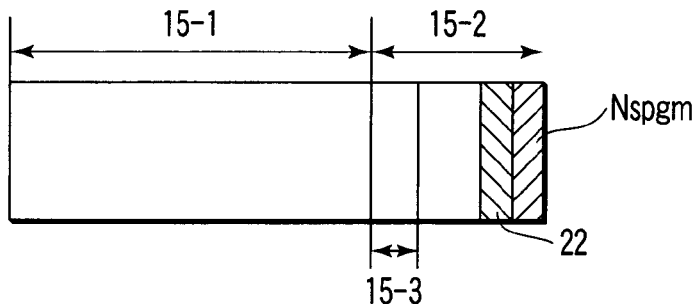
FIG. 3 shows a unit memory area of an SLC area of the semiconductor memory device according to the first embodiment.
Figure 4:
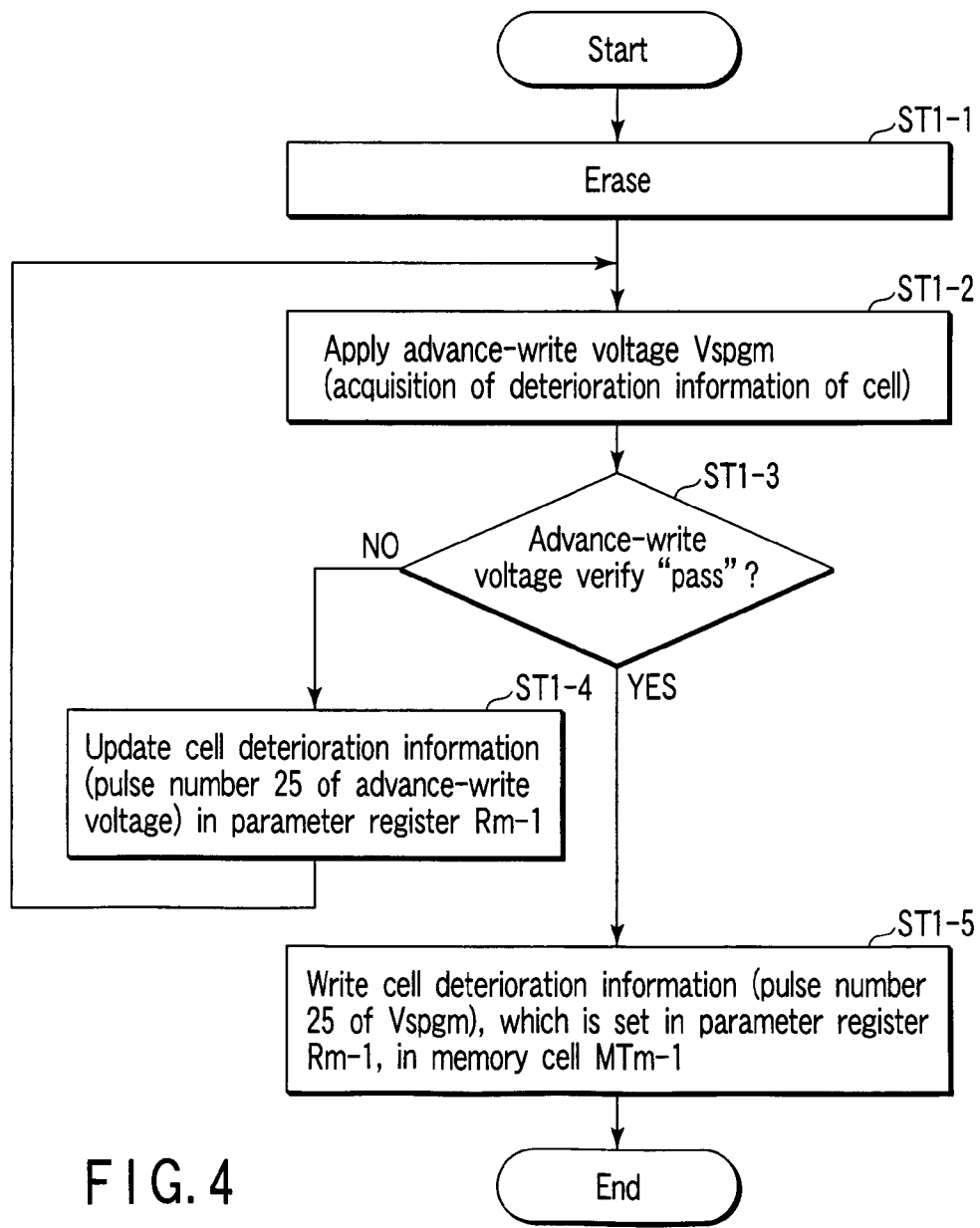
FIG. 4 is a flow chart illustrating an advance-write operation of the semiconductor memory device according to the first embodiment.

To begin with, referring to FIG. 1 to FIG. 3, a semiconductor memory device according to a first embodiment of the present invention is described. FIG. 1 is a block diagram showing the semiconductor memory device according to this embodiment, and FIG. 2 is a circuit diagram showing the semiconductor memory device according to this embodiment. In this embodiment, a NAND flash memory is described as an example of the semiconductor memory device.

As shown in FIG. 1 and FIG. 2, a NAND flash memory 11 includes a voltage generating circuit 20, a memory cell array 12, a row decoder 13, a sense amplifier S/A, a control circuit 14 and parameter registers R0 to Rm+1.

The voltage generating circuit 20 is configured to generate voltages of predetermined values, for example, a write voltage Vpgm, an erase voltage Vera and an advance-write voltage Vspgm which is generated after an erase operation.

The memory cell array 12 includes a plurality of Blocks (Block n−1, Block n, Block n+1, ...) and a memory circuit 15. In this example, the memory circuit 15 is one page which is a unit memory area (to be described later).

For example, the block (Block n) is a single-level NAND flash memory which is configured as an SLC (Single Level Cell) area which is capable of recording 1-bit data in one memory cell transistor MT.

As shown in FIGS. 1 and 2, the block (Block n) includes a plurality of memory cell transistors MT0 to MTm+1, which are arranged in a matrix at intersections between word lines WL0 to WL31 and bit lines BL0 to BLm+1.

Each of the memory cell transistors MT0 to MTm+1 has a stacked structure comprising a tunnel insulation film provided on a semiconductor substrate; a floating electrode FG provided on the tunnel insulation film; an inter-gate insulation film provided on the floating electrode FG; and a control electrode CG provided on the inter-gate insulation film.

Memory cell transistors MT, which neighbor in the direction of the bit line BL, have their sources/drains shared as their current paths. The current paths are connected in series at one end and the other end. In this example, 32 memory cell transistors are connected in series.

A NAND cell column 19 is constituted by the memory cell transistors MT, which have their current paths connected in series at one end and the other end, and select transistors ST1 and ST2. The NAND cell column 19 is selected by the select transistors ST1 and ST2. One end of the current path of the NAND cell column 19 is connected to the sense amplifier S/A, and the other end of the current path is connected to a source line SRC.

The number of memory cell transistors MT is not limited to 32, and may be 8 or 16, for instance. In addition, only one of the select transistors ST1 and ST2 may be provided if the select transistor is configured to be able to select the NAND cell column 19.

The control electrodes CG of the memory cell transistors MT0 to MTm+1 in each row (i.e. in the direction of word line WL) are commonly connected to an associated one of the word lines WL0 to WL31. The gates of the select transistors ST2 are commonly connected to a select gate SGS, and the gates of the select transistors ST1 are commonly connected to a select gate SGD. The source of the select transistor ST2 is connected to a source line SRC, and the drain of the select transistor ST1 is connected to one of the bit lines BL0 to BLm+1.

As indicated by a broken-line box, one page (PAGE) is provided in the direction of the word line WL in association with each of the word lines WL0 to WL31. For example, a page (PAGE2) is present in association with the word line WL2. In the block (Block n) that is the SLC area, one page is present in association with each word line WL. Data is written and read in units of a page. An erase operation is performed batchwise in units of the block (Block n).

Another block (Block n−1, Block n+1) is a multilevel NAND flash memory which is configured as an MLC (Multi Level Cell) area that is capable of recording multi-bit data in one memory cell transistor MT. In the other structural aspects, the block (Block n−1, Block n+1) is the same as the block (Block n).

In this example, the memory circuit 15 is one page (PAGE) which is a unit memory area composed of memory cell transistors MT0 to MTm+1.

For example, PAGE2 in this example has a structure as shown in FIG. 3. As shown in FIG. 3, PAGE2 of the block (Block n) comprises a data area 15-1 (512 Bytes in this example) that stores, data, etc., and a redundant area (16 Bytes) 15-2. The redundant area 15-2 includes an ECC (Error Correcting Code) area 15-3 (3 Bytes), and stores a parameter 22 and a reference pulse number Nspgm of an advance-write voltage Vspgm.

As will be described later, the advance-write voltage Vspgm is a relatively low write voltage, which is applied after the application of an erase voltage Vera to the block (Block), thereby to narrow a threshold voltage distribution width that has greatly increased after the application of the erase voltage Vera to the block (Block). The reason why the advance-write voltage Vspgm is applied is that if the threshold voltage distribution width that has increased after the erase operation is left as such, non-uniformity occurs in the threshold voltage and the write performance deteriorates. In general, the value of the advance-write voltage Vspgm is lower than the value of the write voltage Vpgm (voltage value: Vspgm<Vpgm).

The reference pulse number Nspgm of the advance-write voltage Vspgm is, for example, 3. The parameter 22 determines, for example, an initial value α of the write voltage Vpgm and a step-up width ΔVpgm, as will be described later.

The row decoder 13 is configured to select word lines WL0 to WL31 and select gate lines SGD and SGS in accordance with addresses which are designated from a memory controller (not shown). The row decoder 13 includes transfer gate transistors TGTD and TGTS and transfer transistors (high-voltage transistors) TR0 to TR31, which have gates commonly connected to a transfer gate line TG.

The transfer transistors TR0 to TR31 apply predetermined voltages, such as write voltage Vpgm and advance-write voltage Vspgm, to the control electrodes CG of the memory cell transistors MT.

The sense amplifier S/A is configured to amplify data of each page which is read out of the bit lines BL0 to BLm+1. In this example, the sense amplifier S/A includes a plurality of latch circuits 16-0 to 16-m+1, which have inputs connected to the bit lines BL0 to BLm+1 and have outputs connected to an output terminal (I/O).

The latch circuit 16-0 includes inverters 17-0 and 18-0. The input of the inverter 17-0 is connected to the bit line BL0, and the output of the inverter 17-0 is connected to the input of the inverter 18-0. The output of the inverter 18-0 is connected to the output terminal (I/O). The other latch circuits 16-1 to 16-m+1 have the same structure.

<Advance-write Operation After an Erase Operation>

Next, referring to FIG. 4 to FIG. 9, a description is given of an advance-write operation after an erase operation, which is an embodiment of a control method of the semiconductor memory device according to the present embodiment. The advance-write operation is a write operation which is weakly executed after an erase operation, and the advance-write operation is intended to narrow a threshold voltage distribution width after the erase operation. The description of the advance-write operation is based on a flow chart of FIG. 4.

(Step ST1-1)

Figure 5:
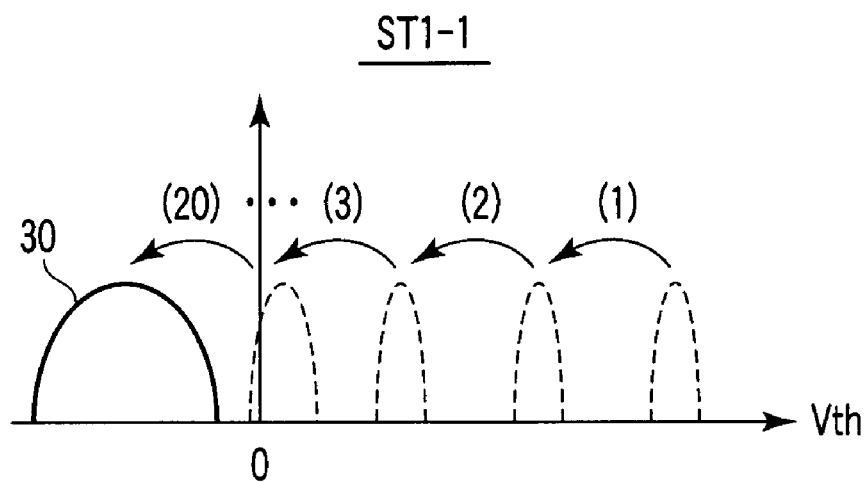
FIG. 5 is a view for explaining an erase operation (ST1-1) according to the first embodiment.

To start with, the control circuit 14 applies a plurality of erase pulses until the threshold voltage distribution reaches a "1" threshold voltage distribution. As shown in FIG. 5, the width of a threshold voltage distribution 30 after the erase operation has greatly increased.

Further, at the time of the erase operation, as shown in FIG. 6, the control circuit 14 reads out the data, which is stored in one page (PAGE2), by means of the sense amplifier S/A, and sets the read-out data in the associated parameter registers R0 to Rm+1. Accordingly, the parameter 22 and the reference pulse number Nspgm of the advance-write voltage Vspgm, which are stored in one page (PAGE2), are set in the parameter registers R0 and Rm+1. The reason why the data in the memory circuit 15 are once set in the parameter registers R0 to Rm+1 is that the sense amplifier S/A is prevented from being occupied by the data. If the sense amplifier S/A is occupied, the data read/write/erase operations are disabled. In order to empty the sense amplifier S/A, it is necessary to copy the data to the parameter registers R0 to Rm+1.

The pulse number 25 of the advance-write write voltage Vspgm, which is counted in a subsequent step ST1-2, is set in the parameter register Rm−1 as "0" that is an initialized value.

(Step ST1-2 (Detection of Cell Degradation Information))

Figure 7:
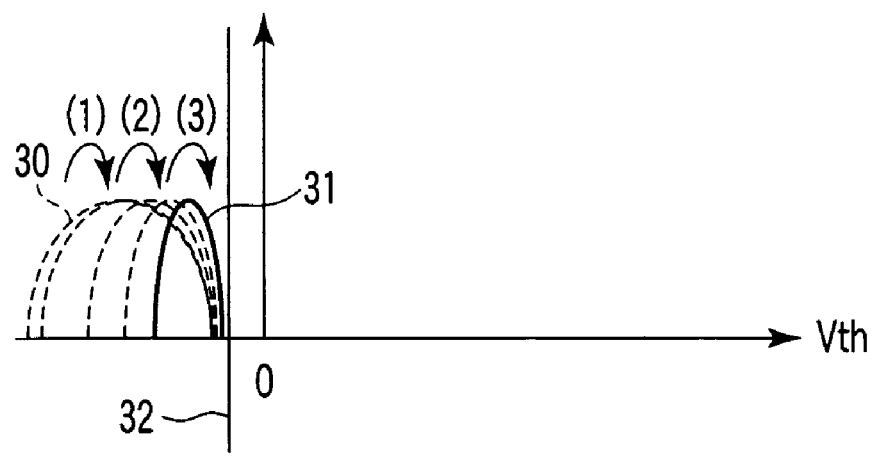
FIG. 7 is a view for explaining the advance-write operation (ST1-2) according to the first embodiment.

Subsequently, as shown in FIG. 7, the control circuit 14 applies the advance-write voltage Vspgm which is a relatively low write voltage, thereby to narrow the width of the threshold voltage distribution 30 that has greatly increased after the application of the erase voltage. At the same time, the control circuit 14 counts the pulse number of the advance-write voltage Vspgm, and sets the counted pulse number 25 in the parameter register Rm−1, for instance.

(Step ST1-3)

Subsequently, the control circuit 14 checks whether the "pass" of an advance-write verify level 32 is enabled or not. Specifically, the control circuit 14 checks whether an upper bottom of the threshold voltage distribution of the memory cell MT reaches a predetermined level or not.

(Step ST1-4)

Figure 8:
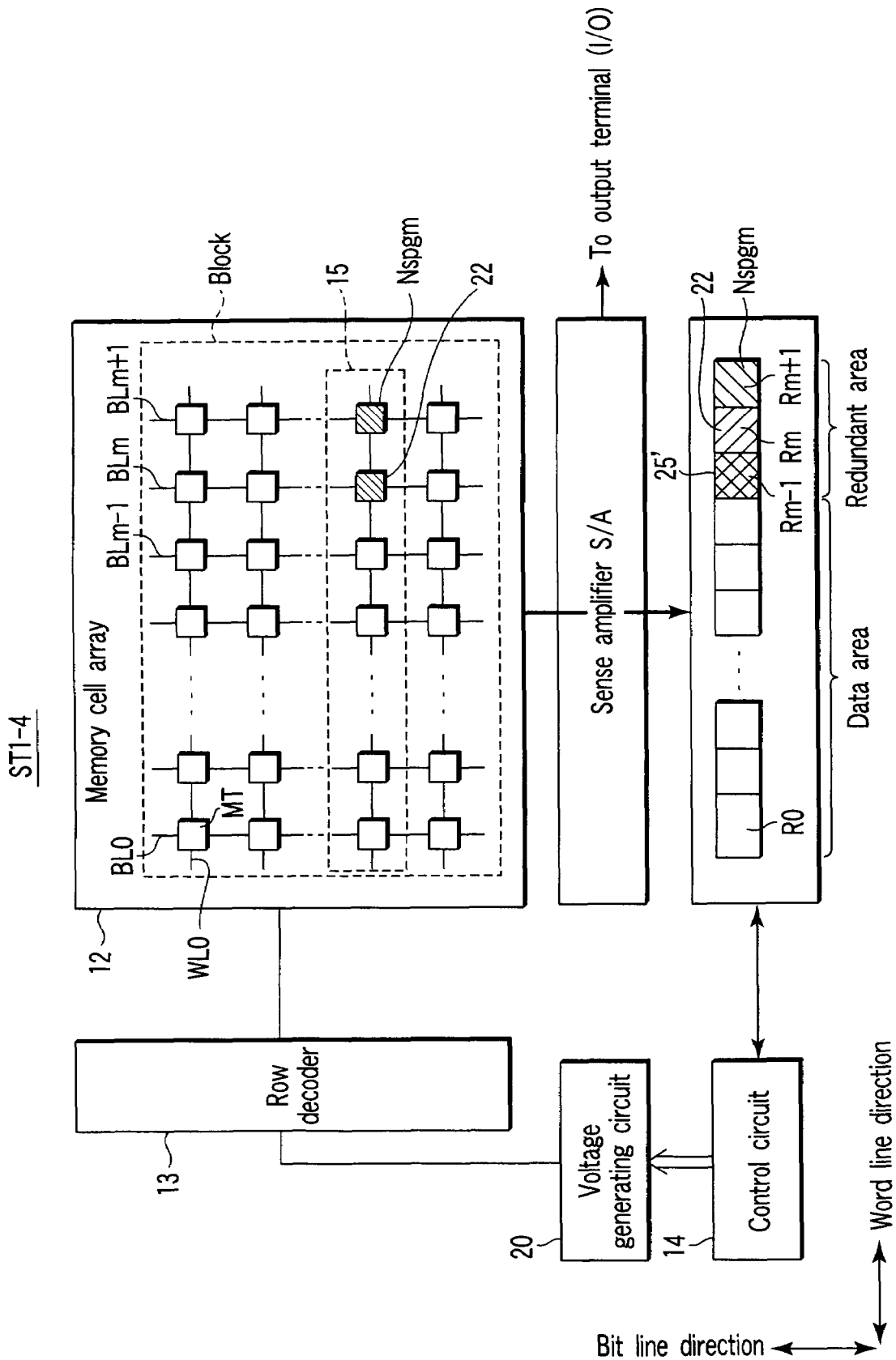
FIG. 8 is a view for explaining the advance-write operation (ST1-4) according to the first embodiment.
Figure 10:
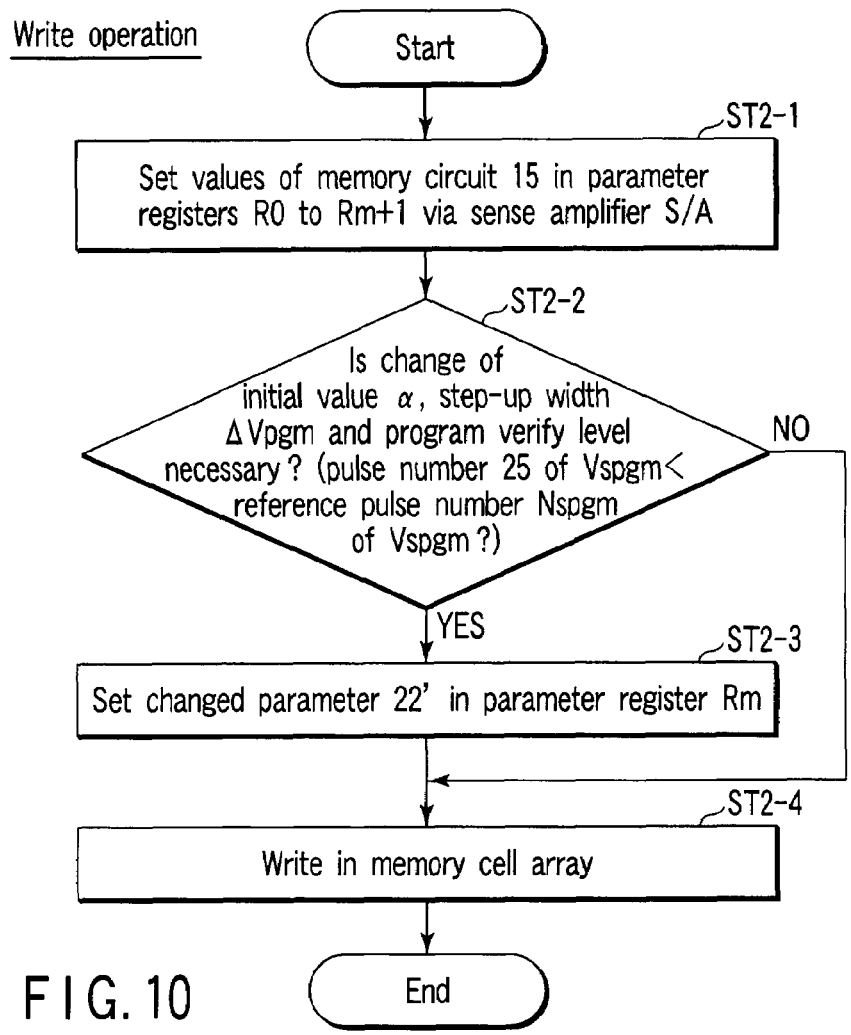
FIG. 10 is a flow chart illustrating a write operation according to the first embodiment.

Then, as shown in FIG. 8, if the result of the above check shows that the pass of the advance-write verify level 32 is not enabled, the control circuit 14 sets the actually counted and updated pulse number 25' of the advance-write voltage in the parameter register Rm−1. The control circuit 14 detects once again the deterioration information of the memory cell MT (step ST1-2) on the basis of the updated pulse number 25' of the advance-write voltage.

(Step ST1-5)

Subsequently, as shown in FIG. 9, if the result of the above check shows that the pass of the advance-write verify level 32 is enabled, the control circuit 14 writes the pulse number 25 of the advance-write voltage Vspgm, which is set in the parameter register Rm−1, in the memory cell MTm−1 of the memory circuit 15.

By repeating the above-described steps, the advance-write operation of the semiconductor memory device according to the present embodiment is executed.

<Write Operation>

Next, referring to FIG. 10 to FIG. 15, a description is given of a write operation, which is an embodiment of the control method of the semiconductor memory device according to the present embodiment. The description of the write operation is based on a flow chart of FIG. 10.

(Step ST2-1)

To start with, the control circuit 14 reads out values of the page 2 (PAGE2), which is the memory circuit 15, by means of the sense amplifier S/A, and sets the read-out values in the associated parameter registers R0 to Rm+1.

(Step ST2-2) Subsequently, the control circuit 14 checks whether a change of the initial value α of the write voltage, the step-up width ΔVpgm of the write voltage and the program verify level is necessary or not. Specifically, the control circuit 14 compares the counted pulse number 25 of the advance-write voltage with the reference pulse number Nspgm of the advance-write voltage, thereby detecting the deterioration information of the memory cell MT.

To be more specific, the control circuit 14 checks whether the pulse number 25 of the advance-write voltage, which is detected in the above-described step ST1-2 and is set in the parameter register Rm−1, is less than the reference pulse number Nspgm of the advance-write voltage (pulse number 25<reference pulse number Nspgm?).

Figure 11:
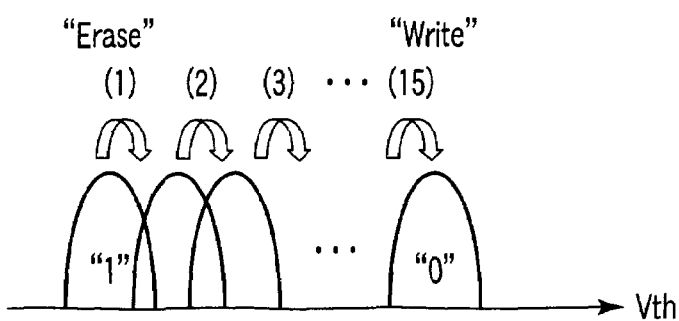
FIG. 11 is a view for explaining a write operation in a memory cell in an initial state.

Specifically, as shown in FIG. 11, when the write operation of the memory cell MT in the initial state is executed, by repeatedly applying the write voltage Vpgm (e.g. 15 pulses) that is slightly increased from the last applied write voltage Vpgm, the threshold voltage distribution is shifted from "1" state to "0" state.

Figure 12:
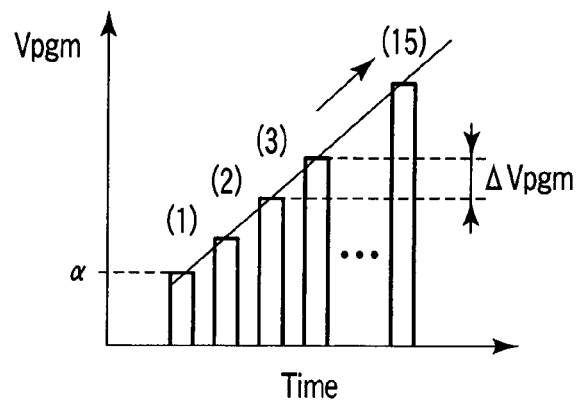
FIG. 12 is a graph showing a relationship between a write voltage Vpgm and a time in a prior-art write operation.

As shown in FIG. 12, the initial value α of the write voltage Vpgm and the step-up width ΔVpgm are determined at the time of a diesort test and are fixed.

Figure 13:
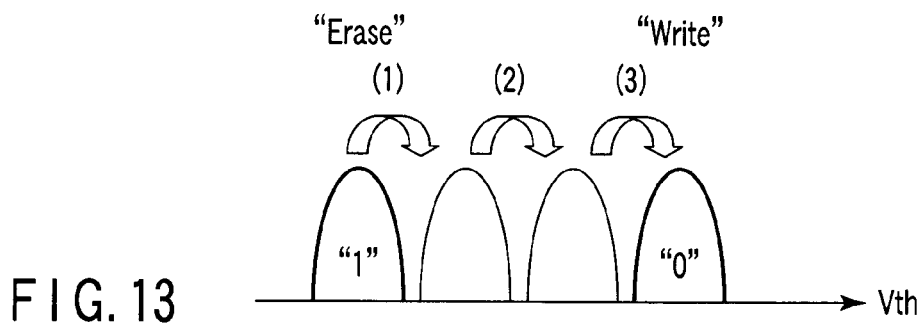
FIG. 13 is a view for explaining a write operation in a memory cell after rewrite has been executed about $10^4$ times.

However, as shown in FIG. 13, if the number of times of rewrite of write/erase operations increases to, e.g. about $10^4$, the characteristics of the cell vary, the speed of the write operation increases and the necessary pulse number decreases (e.g. about 15→about 3).

Figure 14:
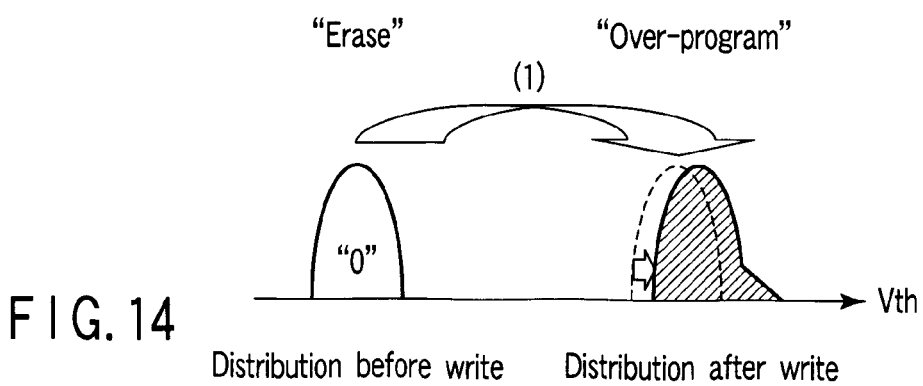
FIG. 14 is a view for explaining a write operation in a memory cell after rewrite has been executed about $10^6$ times in the prior art.

Furthermore, as shown in FIG. 14, if the number of times of rewrite of write/erase operations increases to, e.g. about $10^6$, the "0" threshold voltage distribution is exceeded by the first pulse and over-program occurs. The initial value α of the write voltage Vpgm and the step-up width ΔVpgm are fixed, as shown in FIG. 12. Consequently, in the conventional memory device, even if the pulse number decreases, over-program cannot be prevented.

Hence, in order to prevent the occurrence of over-program, the control circuit 14 checks whether the pulse number 25 of the advance-write voltage is less than the reference pulse number Nspgm of the advance-write voltage (pulse number 25<reference pulse number Nspgm?). For example, when the reference pulse number Nspgm is 3, the control circuit 14 checks whether the actually counted pulse number 25 of Vspgm is less than 3.

(Step ST2-3)

Subsequently, if the result of the above check shows that a change of the initial value α of the write voltage, etc. is necessary (i.e. if the pulse number 25 of the advance-write voltage is less than the reference pulse number Nspgm of the advance-write voltage), the control circuit 14 determines that the characteristics of the memory cell MT have varied. Then, the control circuit 14 changes the parameter 22 in a manner to increase the program verify level, decreasing the initial value α of the write voltage and the step-up width ΔVpgm. The control circuit 14 sets the changed parameter 22' in the parameter register Rm, for instance.

Figure 15:
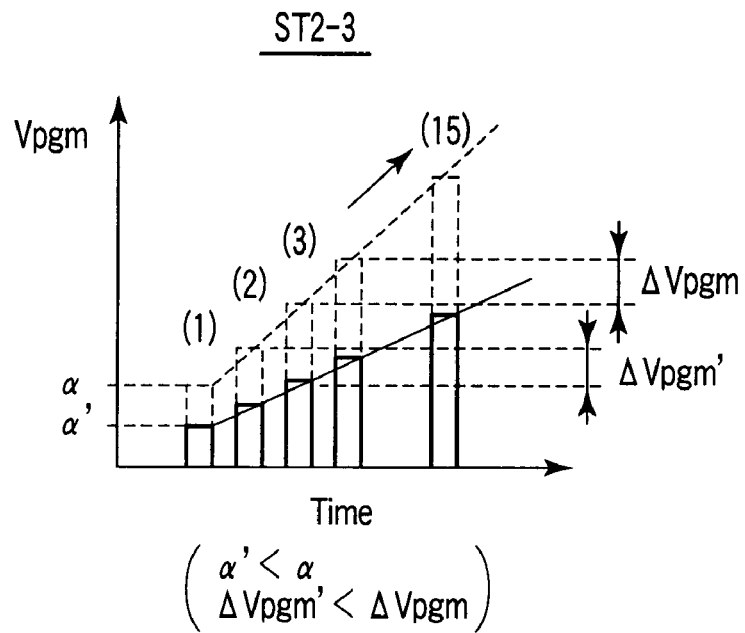
FIG. 15 is a graph showing a relationship between a write voltage Vpgm and a time in a write operation according to the first embodiment.

With use of the changed parameter 22', as shown in FIG. 15, the control circuit 14 can control the voltage generating circuit 20 so as to set a changed initial value α' that is less than the initial value α (α'<α) and a changed step-up width ΔVpgm' that is less than the step-up width ΔVpgm (ΔVpgm'<ΔVpgm).

(Step ST2-4)

If the result of the above check shows that a change of the initial value α of the write voltage, etc. is not necessary, the control circuit 14 determines that the characteristics of the memory cell MT have not varied. Thus, the control circuit 14 controls the voltage generating circuit 20 so as to execute write of a predetermined page in the memory cell array 12, by using the pre-change parameter 22 (the initial value α, step-up width ΔVpgm, program verify level).

On the other hand, if the result of the above check shows that a change of the initial value α of the write voltage, etc. is necessary, the control circuit 14 determines that the characteristics of the memory cell MT have varied. Thus, the control circuit 14 controls the voltage generating circuit 20 so as to execute write of a predetermined page in the memory cell array 12, by using the changed parameter 22' (the initial value α', step-up width ΔVpgm', changed program verify level).

By repeating the above-described steps ST2-1 to ST2-4, the write operation of the semiconductor memory device according to the present embodiment is executed. By the write operation of this embodiment, data write can be executed in a predetermined page, either before or after the increase in the number of times of rewrite.

At least the following advantageous effects (1) and (2) can be obtained by the semiconductor memory device and the control method thereof according to the present embodiment.

(1) Even if the number of times of rewrite increases, the occurrence of over-program can be prevented and the number of defective elements can be reduced.

In the semiconductor memory device according to this embodiment, the reference number Nspgm of the advance-write voltage Vspgm is stored in the memory cell transistor TMm+1 of the memory circuit 15.

In step ST2-2 of the write operation, the control circuit 14 checks whether the pulse number 25 of the advance-write voltage, which is detected in the above-described step ST1-2 of the advance-write operation and is set in the parameter register Rm−1, is less than the reference pulse number Nspgm of the advance-write voltage (pulse number 25<reference pulse number Nspgm?).

If the number of times of rewrite increases, the characteristics of the memory cell MT have varied, as shown in FIG. 13 and FIG. 14. In this case, data write becomes easier, and the pulse number of the advance-write voltage Vspgm decreases. On the other hand, in the case where the characteristics of the memory cell MT have not varied, data write does not become easier, and the pulse number of the advance-write voltage Vspgm is unchanged. Thus, by executing the above-described check, the control circuit 14 can detect the deterioration information of the memory cell MT.

Further, in the case where the characteristics of the memory cell MT have varied, the control circuit 14 sets in the parameter register Rm the parameter 22' that has been changed so as to obtain the initial value α' and the step-up width ΔVpgm', as shown in FIG. 15 (ST2-3). Subsequently, the control circuit 14 controls the voltage generating circuit 20 by using the parameter 22', and executes the write operation in the memory cell array 12 (ST2-4).

Figure 16:
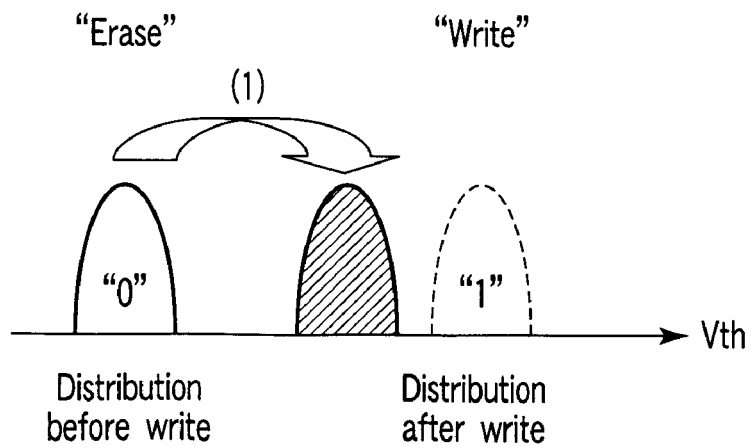
FIG. 16 is a view for explaining a write operation in a memory cell after rewrite has been executed about $10^6$ times in the semiconductor memory device according to the first embodiment.

As a result, as shown in FIG. 16, over-program can be prevented even in the memory cell MT which has executed data rewrite, e.g. about $10^6$ times, and has deteriorated so that the "0" threshold voltage distribution is exceeded by the first pulse and over-program occurs. Therefore, a defective element in the prior art, in which an write defect has occurred, can be remedied, and the number of defective elements can be reduced.

(2) Even after a diesort test, the write operation can be executed in accordance with the deterioration state of the memory cell MT.

In the case of the present embodiment, programming, such as data write and data erase, can electrically be performed in the memory cell transistors MT0 to MTm+1 that constitute the memory circuit 15.

Thus, even after the diesort test of the NAND flash memory 11, the reference pulse number Nspgm of advance-write voltage Vspgm and the value of the parameter 22 can be re-programmed. The diesort test refers to a process of testing electrical characteristics of the memory cell array 12 in the state in which the memory cell array 12 is formed on the wafer. According to this embodiment, even after the diesort test, the write operation can be executed in accordance with the deterioration state of the memory cell MT.

Moreover, in the case of this embodiment, the memory circuit 15, which stores the parameter 22 that is the deterioration information and the reference pulse number Nspgm of the advance-write voltage, is provided in association with each block (Block). Therefore, the write operation can advantageously be performed in accordance with the state of variation of the characteristics of the memory cells MT in each block (Block).

[Second Embodiment (Example Including a Cache Memory)]

Next, a semiconductor memory device according to a second embodiment of the invention is described with reference to FIG. 17. This embodiment relates to an example in which a cache memory is further included. In the description below, a detailed description of the parts common to those in the first embodiment is omitted.

Figure 17:
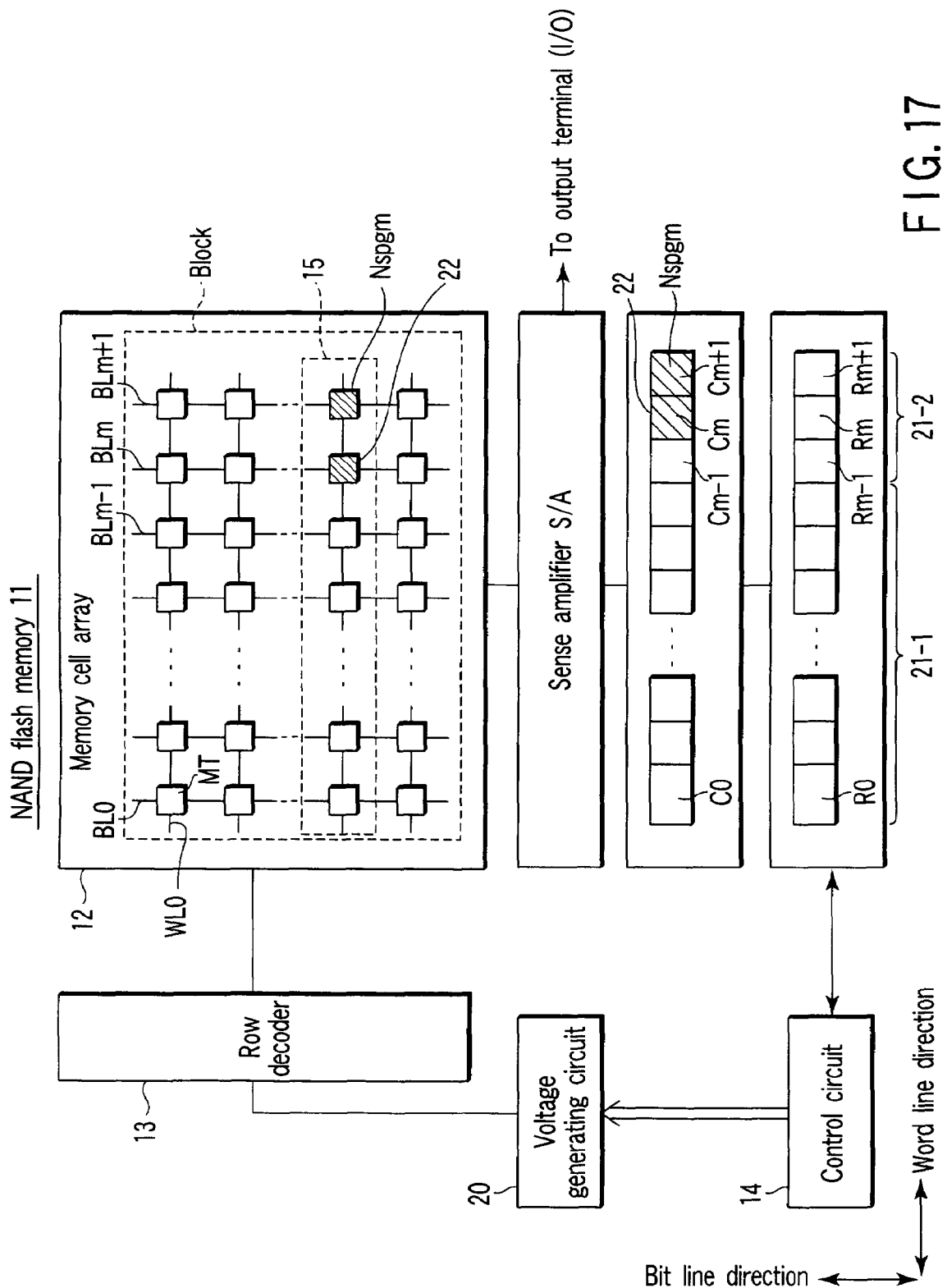
FIG. 17 is a block diagram showing a semiconductor memory device according to a second embodiment of the present invention.

As shown in FIG. 17, the semiconductor memory device of the second embodiment differs from that of the first embodiment in that the semiconductor memory device further includes cache memories C0 to Cm+1 which have inputs connected to the sense amplifier S/A and have outputs connected to the parameter registers R0 to Rm+1. For example, an SRAM (Static Random-Access Memory) is applied to each of the cache memories C0 to Cm+1.

The data, such as the parameter 22, in the memory circuit 15 are read out batchwise in advance via the sense amplifier S/A into the cache memories C0 to Cm+1, for example, when power is turned on (power-on operation time). For example, the second embodiment differs from the first embodiment in that at the power-on operation time, the parameter 22 and the reference pulse number Nspgm of the advance-write voltage are read out to the cache memories Cm and Cm+1.

<Write Operation>

Figure 18:
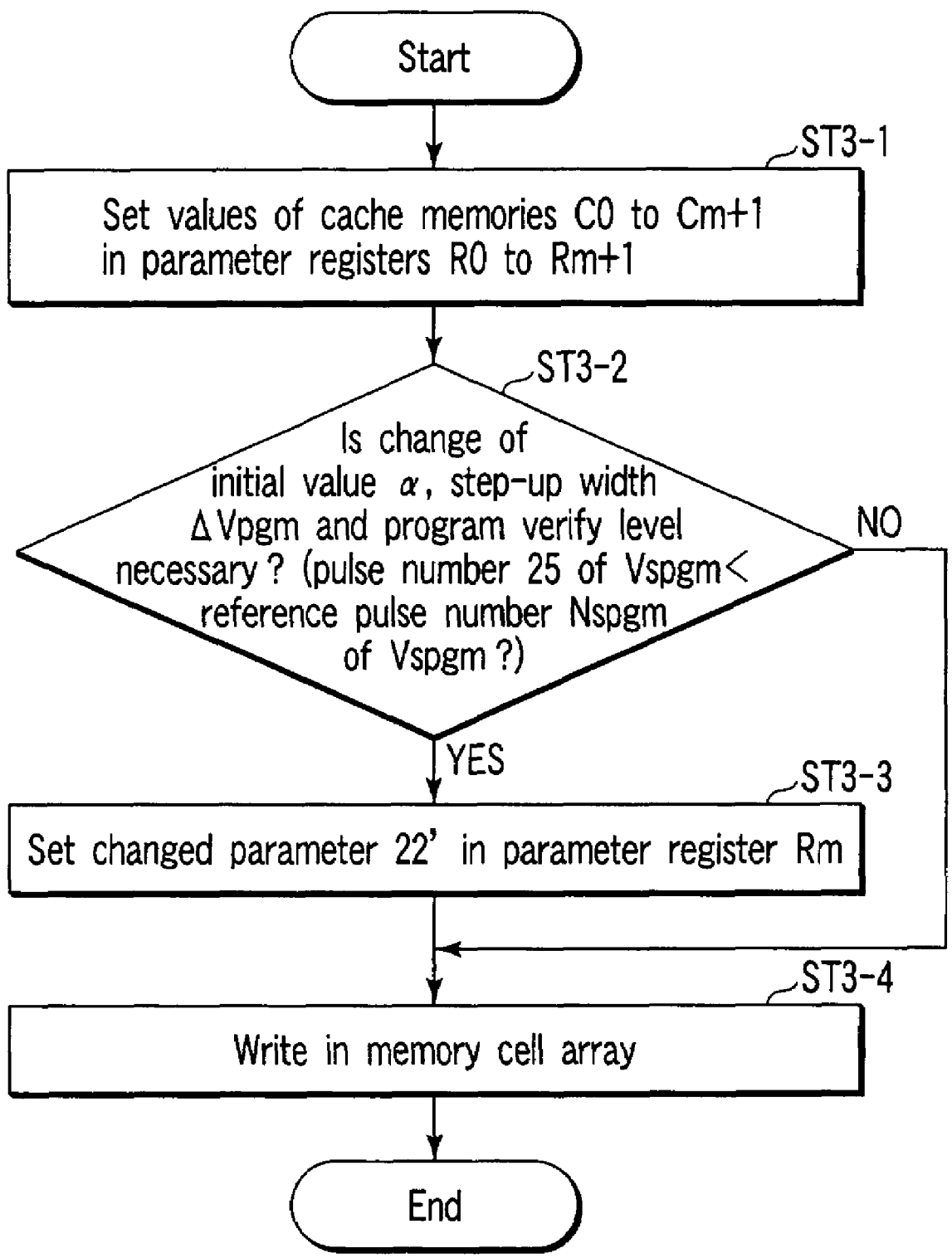
FIG. 18 is a flow chart illustrating a write operation of the semiconductor memory device according to the second embodiment.

Next, referring to a flow chart of FIG. 18, a description is given of a write operation, which is an embodiment of the control method of the semiconductor memory device according to the present embodiment.

(Step ST3-1)

To start with, the control circuit 14 sets the data, which have been read out to the cache memories C0 to Cm+1 in advance, in the associated parameter registers R0 to Rm+1. For example, the parameter 22 that is stored in the cache memory Cm and the reference pulse number Nspgm that is stored in the cache memory Cm+1 are set in the associated parameter registers R0 and Rm+1.

The reason why the control circuit 14 can immediately set the parameter 22, etc. in the parameter registers R0 to Rm+1 at the time of the write operation is that the parameter 22, etc. in the memory circuit 15 are read out batchwise in advance into the cache memories C0 to Cm+1 at the time of the power-on operation.

Subsequently, the same steps ST3-2 to ST3-4 of the write operation as in the first embodiment are executed, and the write operation of the present embodiment is carried out.

As described above, according to the present embodiment, the same advantageous effects as the above-described (1) and (2) can be obtained. Furthermore, the following advantageous effect (3) is obtained.

(3) A high-speed operation can advantageously be performed.

As described above, the semiconductor memory device of this embodiment includes the cache memories C0 to Cm+1. In addition, the control circuit 14 reads out batchwise the data, such as parameter 22, which are stored in the memory circuit 15, into the cache memories C0 to Cm+1 in advance at the time of the power-on operation.

Thus, there is no need to perform the step of reading out the data, such as parameter 22, from the memory circuit 15 of the memory cell array 12 each time the above-described write operation is executed. Therefore, the speed of the overall operation of the NAND flash memory 11 can advantageously be increased.

The cache memories C0 to Cm+1 are composed of, e.g. SRAMs which can operate at high speed. Therefore, high-speed access can advantageously be executed.

The structure and operation of the present embodiment can be applied, as needed.

[Third Embodiment (Example of Multilevel Nand Flash Memory)]

Next, referring to FIG. 19 to FIG. 27, a semiconductor memory device according to a third embodiment is described. This embodiment relates to an example in which the invention is applied to a multilevel NAND flash memory which is capable of storing multi-bit data in one memory cell MT. In the description below, a detailed description of the parts common to those in the first embodiment is omitted. In the present embodiment, a 4-value multilevel NAND flash memory is described as an example of the multilevel NAND flash memory.

<Example of Structure>

Figure 19:
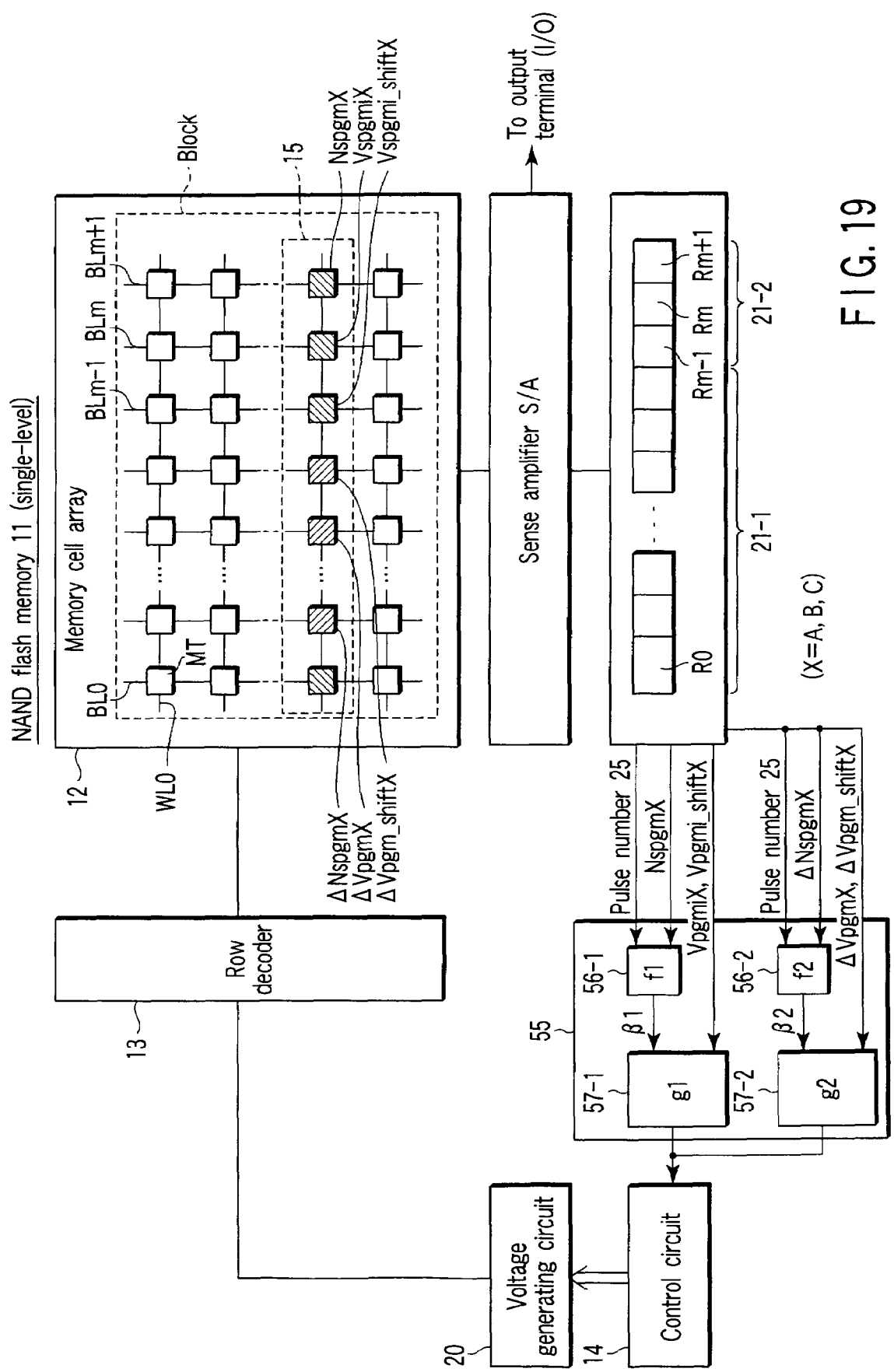
FIG. 19 is a block diagram showing a semiconductor memory device according to a third embodiment of the present invention.

To begin with, referring to FIG. 19, a description is given of an example of the structure of the semiconductor memory device according to the present embodiment.

As shown in FIG. 19, the semiconductor memory device of this embodiment differs from that of the first embodiment in the following respects.

The memory circuit 15 stores a reference pulse number NspgmX, a reference voltage VpgmiX, a voltage correction amount Vpgmi_shiftX, a reference pulse number $\Delta$NspgmX of a step-up width, a reference voltage $\Delta$VpgmX of a step-up width, and a voltage correction amount $\Delta$Vpgm_shiftX of a step-up width. A, B and C are substituted for the "X" in these symbols. Actually, the memory circuit 15 stores reference pulse numbers NspgmrA to NspgmC, reference voltages VpgmiA to VpgmiC, voltage correction amounts Vpgmi_shiftA to Vpgmi_shiftC, reference pulse numbers $\Delta$NspgmA to $\Delta$NspgmC of a step-up width, reference voltages $\Delta$VpgmA to $\Delta$VpgmC of a step-up width, and voltage correction amounts $\Delta$Vpgm_shiftA to $\Delta$Vpgm_shiftC of a step-up width.

In this embodiment, an arithmetic circuit 55 which determines a parameter is provided.

The arithmetic circuit 55 comprises deterioration information detection circuits 56-1 and 56-2 and shift amount determination circuits 57-1 and 57-2.

The deterioration information detection circuit 56-1 is configured to execute a function f1 (parameter 25, NspgmX) for detecting deterioration information $\beta$1 on the basis of the parameter 25, which is the pulse number, and the reference pulse number NspgmX.

The deterioration information detection circuit 56-2 is configured to execute a function f2 (parameter 25, $\Delta$NspgmX) for detecting deterioration information $\beta$2 on the basis of the parameter 25, which is the pulse number, and the reference pulse number $\Delta$NspgmX of the step-up width.

The shift amount determination circuit 57-1 is configured to execute a function g1 ($\beta$1, VpgmiX, Vpgmi_shiftX) for determining a shift amount of the initial value at a time of step-up write, on the basis of the deterioration information $\beta$1, reference voltage VpgmiX, and voltage correction amount Vpgmi_shiftX.

The shift amount determination circuit 57-2 is configured to execute a function g2 ($\beta$2, $\Delta$VpgmX, $\Delta$Vpgm_shiftX) for determining a shift amount of the initial value at a time of step-up write, on the basis of the deterioration information $\beta$2, reference voltage $\Delta$VpgmX of the step-up width, and voltage correction amount $\Delta$Vpgm_shiftX of the step-up width.

<Re: Reference Pulse Number NspgmX, Etc. Stored in the Memory Circuit and Threshold Voltage Distributions (4 Values)>

Next, referring to FIG. 20 and FIG. 21, a detailed description is given of the reference pulse number NspgmX, reference voltage VpgmiX, voltage correction amount Vpgmi_shiftX, reference pulse number ΔNspgmX for determining whether or not to change the step-up width, reference voltage ΔVpgmX of the step-up width and voltage correction amount ΔVpgm_shiftX of the step-up width, which are stored in the memory circuit 15, and threshold voltage distributions (4 values).

FIG. 20 shows the reference pulse number NspgmX, reference voltage VpgmiX, voltage correction amount Vpgmi_shiftX, reference pulse number ΔNspgmX for determining whether or not to change the step-up width, reference voltage ΔVpgmX of the step-up width and voltage correction amount ΔVpgm_shiftX of the step-up width, which are stored in the memory circuit 15.

In addition, FIG. 21 shows threshold voltage distributions of the multilevel NAND flash memory according to the present embodiment. As shown in FIG. 21, the threshold voltage distributions are discriminated by four threshold voltage values, i.e. "11(E)" that is "erase state", and "01(A)", "10(B)" and "00(C)" that are "write states".

Thus, the reference pulse numbers NspgmX, reference voltages VpgmiX and voltage correction amounts Vpgmi_shiftX, which are shown in FIG. 21, are defined as follows. The reference pulse numbers NspgmX, etc., are stored in the deterioration information detection circuit 56-1 and shift amount determination circuit 57-1 at the time of the write operation (to be described below).

NspgmA: a reference pulse number which determines whether or not to shift the initial value at a time of a write operation of the "01(A)" level;

NspgmB: a reference pulse number which determines whether or not to shift the initial value at a time of a write operation of the "10(B)" level;

NspgmC: a reference pulse number which determines whether or not to shift the initial value at a time of a write operation of the "00(C)" level;

VpgmiA: a reference voltage which determines the initial value at a time of a write operation of the "01(A)" level;

VpgmiB: a reference voltage which determines the initial value at a time of a write operation of the "10(B) " level;

VpgmiC: a reference voltage which determines the initial value at a time of a write operation of the "00(C)" level;

Vpgmi_shiftA: a voltage correction amount of the initial value at a time of a write operation of the "01(A)" level;

Vpgmi_shiftB: a voltage correction amount of the initial value at a time of a write operation of the "10(B)" level; and Vpgmi_shiftC: a voltage correction amount of the initial value at a time of a write operation of the "00(C)" level.

Similarly, the reference pulse numbers ΔNspgmX which determines whether or not to shift the step-up width, the reference voltages ΔVpgmX of the step-up width and the voltage correction amounts ΔVpgm_shiftX of the step-up width are defined as follows. The reference pulse numbers ΔNspgmX of the step-up width, etc., are stored in the deterioration information detection circuit 56-2 and shift amount determination circuit 57-2 at the time of the write operation (to be described below).

ΔNspgmA: a reference pulse number which determines whether or not to shift the step-up width at a time of a write operation of the "01(A)" level;

ΔNspgmB: a reference pulse number which determines whether or not to shift the step-up width at a time of a write operation of the "10(B)" level;

ΔNspgmC: a reference pulse number which determines whether or not to shift the step-up width at a time of a write operation of the "00(C)" level;

ΔVpginA: a reference voltage which determines the step-up width at a time of a write operation of the "01(A)" level;

ΔVpgmB: a reference voltage which determines the step-up width at a time of a write operation of the "10(B)" level;

ΔVpgmC: a reference voltage which determines the step-up width at a time of a write operation of the "00(C)" level;

ΔVpgm_shiftA: a voltage correction amount of the step-up width at a time of a write operation of the "01(A)" level;

ΔVpgm_shiftB: a voltage correction amount of the step-up width at a time of a write operation of the "10(B)" level;

ΔVpgm_shiftC: a voltage correction amount of the step-up width at a time of a write operation of the "00(C)" level; and

25: a parameter.

The reference pulse number NspgmX, etc. are stored in the memory circuit 15 from the initial state. On the other hand, the parameter 25 is representative of the pulse number, i.e. the number of times of pulse application at the advance-write time, and is stored in the parameter registers at the time of the write operation.

Various voltages VsenX shown in FIG. 21 are defined as follows:

VsenEV: an erase verify level voltage;

VsenAV: a program verify level voltage of "01"(A) level;

VsenBV: a program verify level voltage of "10"(B) level;

VsenCV: a program verify level voltage of "00"(C) level;

VsenAR: a "11(E)"/"01(A)" discrimination level voltage;

VsenBR: a "01(A)"/"10(B)" discrimination level voltage;

VsenCR: a "10(B)"/"00(C)" discrimination level voltage; and

VsenU: a sense-time voltage for a non-selected word line (WL).

<Write Operation>

Figure 22:
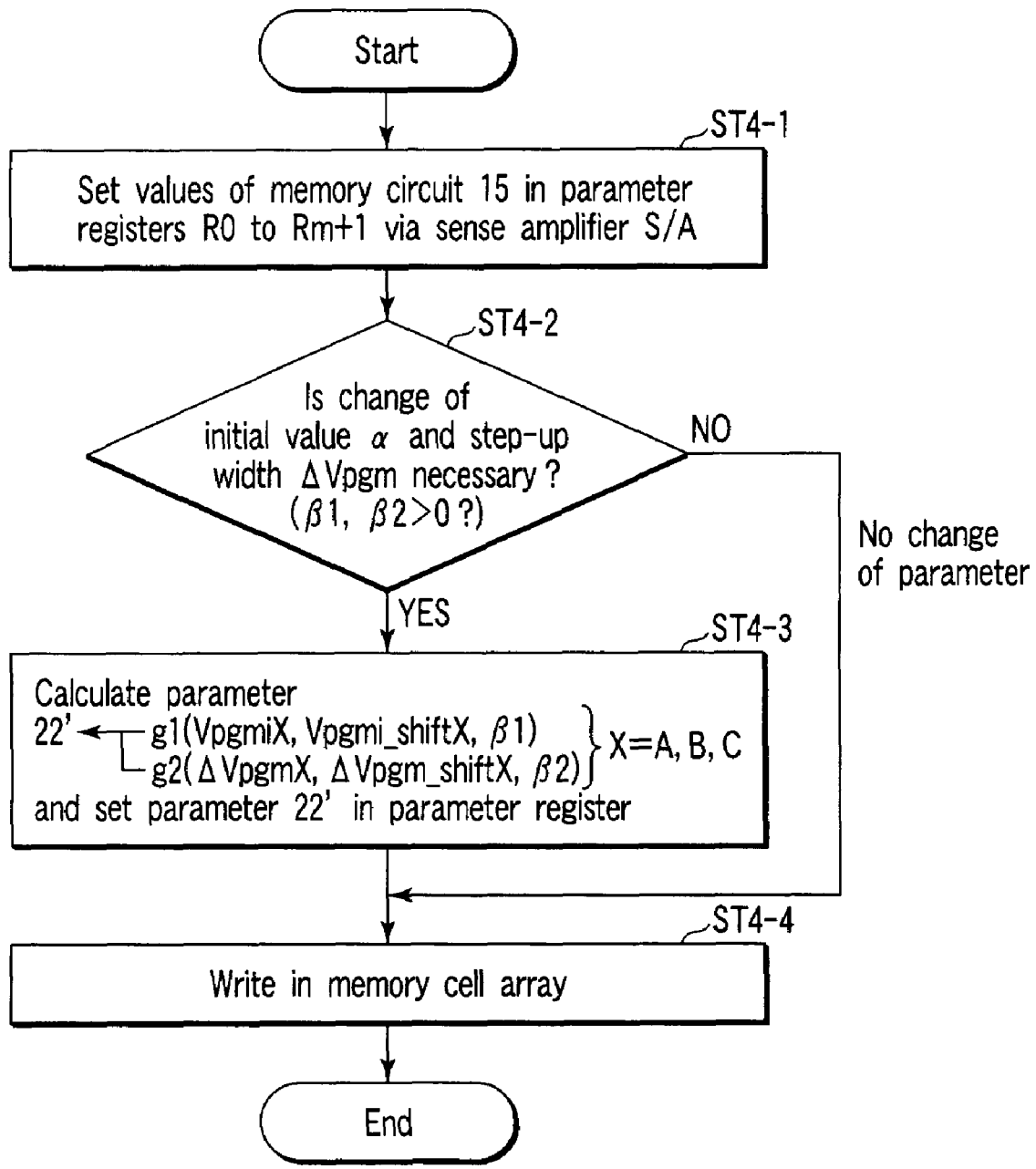
FIG. 22 is a flow chart illustrating a write operation of the semiconductor memory device according to the third embodiment.
Figure 23:
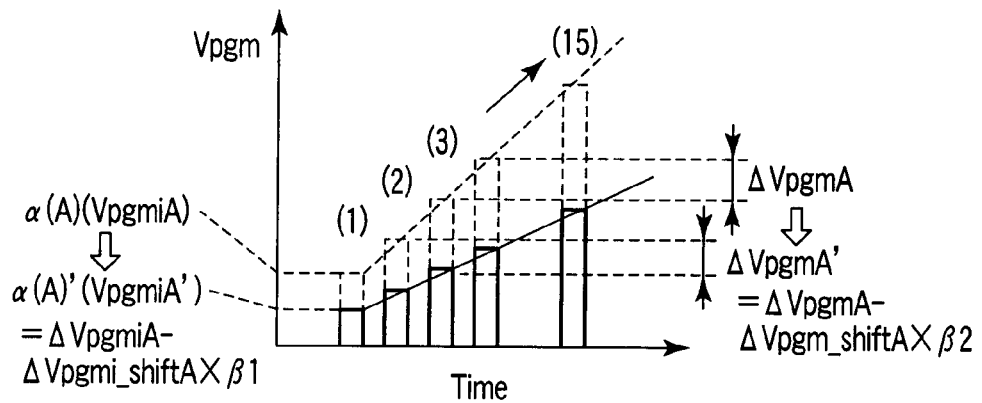
FIG. 23 is a view illustrating a step of the write operation in the third embodiment.

Next, referring to FIG. 22 and FIG. 23, a description is given of a write operation of the semiconductor memory device according to the present embodiment. The description of the write operation is based on a flow chart of FIG. 22.

(Step ST4-1)

To start with, the control circuit 14 reads out values of a certain page, which is the memory circuit 15, by means of the sense amplifier S/A, and sets the read-out values in the associated parameter registers R0 to Rm+1.

(Step ST4-2 (Detection of Deterioration Information β1, β2))

Subsequently, the control circuit 14 checks whether a change of the initial value α of the write voltage, the step-up width ΔVpgm of the write voltage and the program verify level is necessary or not. Specifically, the control circuit 14 compares the counted pulse number 25 of the advance-write voltage with the reference pulse number NspgmX of the advance-write voltage as well as with the reference pulse number ΔNspgmX of the step-up width, thereby detecting the deterioration information of the memory cell MT.

To be more specific, the deterioration information detection circuits 56-1 and 56-2 execute the function f1 (parameter 25, NspgmX) and function f2 (parameter 25, ΔNspgmX) for detecting deterioration information β1 and β2. In the case of the present embodiment, f1 (parameter 25, NspgmX) and f2 (parameter 25, ΔNspgmX) execute arithmetic operations expressed by the following equations (※1) and (※1):

$$f1(\text{parameter 25}, NspgmX) = NspgmX - 25 = \beta1 \quad (※_1)$$

$$f2(\text{parameter 25}, \Delta NspgmX) = \Delta NspgmX - 25 = \beta2 \quad (※_2)$$

Specifically, the deterioration information detection circuits 56-1 and 56-2 execute arithmetic operations to determine whether the deterioration information β1, β2 is greater than 0 (β1, β2>0?). In other words, the deterioration information detection circuits 56-1 and 56-2 calculate differences between the counted pulse number (parameter) 25 set in the parameter register and the reference pulse number NspgmX and the reference pulse number ΔNspgmX.

For example, in the case where the reference pulse number NspgmX is 3, the deterioration information detection circuit 56-1 calculate a difference between the actually counted pulse number 25 and 3. Based on the result of the arithmetic operation, it can be detected that the degree of deterioration of the memory cell is greater as the deterioration information β1, β2 has a greater value.

If the result of the arithmetic operation shows that the deterioration information β1, β2 is not a positive value, the parameter 22 is not changed and the process goes to step ST4-4 of executing the write operation.

The reason for executing the above process step is as follows. As shown in FIG. 13, if the number of times of rewrite of write/erase operations increases to, e.g. about $10^4$, the characteristics of the cell vary, the speed of the write operation increases and the necessary pulse number decreases (e.g. about 15→about 3).

Further, as shown in FIG. 14, if the number of times of rewrite of write/erase operations increases to, e.g. about $10^6$, the write threshold voltage distribution is exceeded by the first pulse and over-program occurs.

(Step ST4-3 (Calculation of Shift Amount))

If the result of the above check shows that a change of the initial value α of the write voltage and the step-up width ΔVpgm of the write voltage is necessary (β1, β2>0), the control circuit 14 determines that the characteristics of the memory cell MT have varied. Thus, in this step ST4-3, the shift amount determination circuit 57-1 and 57-2 execute arithmetic operations to determine how much the initial values α(A) to α(C) of the write voltage and the step-up widths ΔVpgmA to ΔVpgmC are to be shifted with respect to the threshold voltage distributions "01(A)" to "00(C)".

Specifically, the shift amount determination circuit 57-1 executes the function g1 (VpgmiX, Vpgmi_shiftX, β1) on the basis of the deterioration information β1, etc. The shift amount determination circuit 57-2 executes the function g2 (ΔVpgmX, Vpgm_shiftX, β2) on the basis of the deterioration information β2, etc.

In the case of the present embodiment, the function g1 and function g2 execute the arithmetic operation indicated by the following equations (※※1) and (※※2):

function g1(*VpgmiX, Vpgmi*_shift*X*, β1)=*VpgmiX*−
*Vpgmi*_shift*X*×β1=22'

(※※1)

function g2(Δ*VpgmX*, Δ*Vpgm*_shift*X*β2)=Δ*VpgmX*−
Δ*Vpgm*_shift*X*×β2=22'

(※※2)

Specifically, in the case of the present embodiment, the shift amount determination circuits 57-1 and 57-2 determine the shift amounts so that the shift amounts become smaller in accordance with the magnitudes of the deterioration information β1, β2.

Subsequently, the control circuit 14 sets the parameter 22', which is the changed parameter of the parameter 22, in the parameter register.

(Step ST4-4 (Write in Memory Cell Array))

If the result of the above check shows that a change of the initial value α of the write voltage, etc. is not necessary, the control circuit 14 determines that the characteristics of the memory cell MT have not varied. Thus, the control circuit 14 controls the voltage generating circuit 20 so as to execute data write in a predetermined page of the memory cell array 12, on the basis of the pre-change parameter 22 (the initial value α, step-up width ΔVpgm, program verify level).

On the other hand, if the result of the above check shows that a change of the initial value α of the write voltage, etc. is necessary, the control circuit 14 determines that the characteristics of the memory cell MT have varied. Thus, the control circuit 14 controls the voltage generating circuit 20 so as to execute data write in a predetermined page of the memory cell array 12, on the basis of the changed parameter 22' (the initial value α, step-up width ΔVpgm', changed program verify level).

If the changed parameter 22' is used, the control circuit 14 controls the write operation of the "01(A)" level, for example, as shown in FIG. 23.

As shown in FIG. 23, the control circuit 14 controls the voltage generating circuit 20 so as to produce an initial value α(A)' that is less than the initial value α(A) (α(A)'<α(A)) and a step-up width ΔVpgmA' that is less that the step-up width ΔVpgmA (ΔVpgmA'<ΔVpgmA).

As expressed in the equation (※※1), the shift width of the initial value α(A)' is determined by VpgmiX−Vpgmi_shiftX×β1. Similarly, as expressed in the equation (※※2), the shift width of the step-up width ΔVpgmA' is determined by ΔVpgmX−ΔVpgm_shiftX×β2.

The variation of Vpgm is not limited to FIG. 23, and the arithmetic circuit 55 can arbitrarily vary the initial value α of the write operation and the step-up width ΔVpgm.

Figure 24:
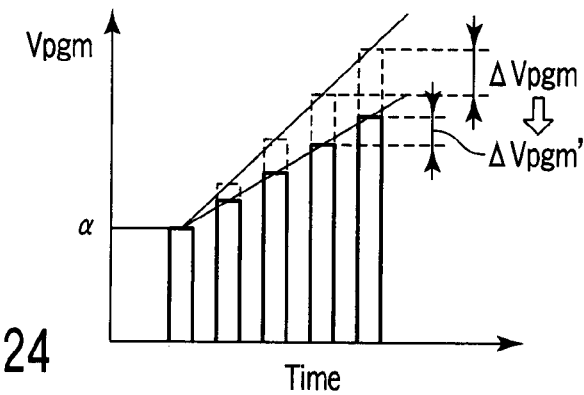
FIG. 24 is a view illustrating a step of the write operation in the third embodiment.

For example, in the case where only the step-up width is to be varied to become smaller without changing the initial value α(β1≦0, β2>0), the Vpgm is as shown in FIG. 24.

Figure 25:
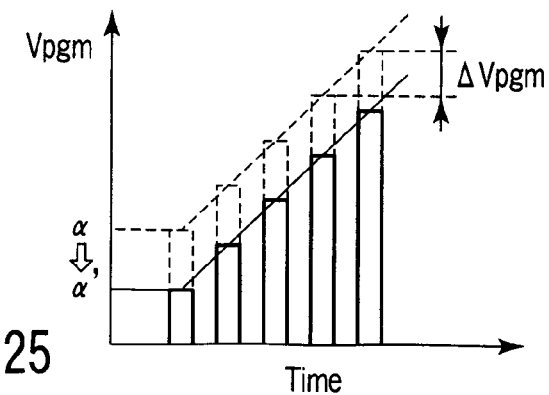
FIG. 25 is a view illustrating a step of the write operation in the third embodiment.

In addition, for example, in the case where only the initial value α is to be varied to become smaller without changing the step-up width (β1≦0, β2>0), the Vpgm is as shown in FIG. 25.

Although not shown, it is possible, as a matter of course, to execute a write operation with the parameter 22 in the initial state, without varying the initial value or the step-up width.

By repeating the above steps ST4-1 to ST4-4 for the entire memory cell array, the write operation of the semiconductor memory device according to this embodiment is carried out. By the write operation of this embodiment, data write can be executed in a predetermined page, either before or after the increase in the number of times of rewrite.

<Advantageous Effects of the Present Embodiment>

According to the semiconductor memory device of this embodiment and the control method thereof, at least the above-described advantageous effects (1) and (2) can be obtained. Moreover, in this embodiment, at least the following advantageous effect (4) can be obtained.

(4) Even in the case of the multilevel NAND flash memory, the write operation can be executed with respect to each threshold voltage value in accordance with the deterioration state of the memory cell, and the number of defective cells can be reduced.

As described above, in the present embodiment, the memory circuit 15 stores the reference pulse number NspgmX, the reference voltage VpgmiX, the voltage correction amount Vpgmi_shiftX, the reference pulse number ΔNspgmX of the step-up width, the reference voltage ΔVpgmX of the step-up width, and the voltage correction amount ΔVpgm$_{13}$ shiftX of the step-up width.

Moreover, the memory device of this embodiment includes the arithmetic circuit 55 which comprises the deterioration information detection circuits 56-1 and 56-2 and the shift amount determination circuits 57-1 and 57-2.

Thus, even in the case where the number of times of write increases and a defective cell occurs, the initial value Δ of the write operation and the step-up width ΔVpgm can be controlled with respect to each of threshold voltage values. As a result, even in the case of the multilevel NAND flash memory, the write operation can be executed with respect to each threshold voltage value in accordance with the deterioration state of the memory cell, and the number of defective cells can be reduced.

Figure 26:
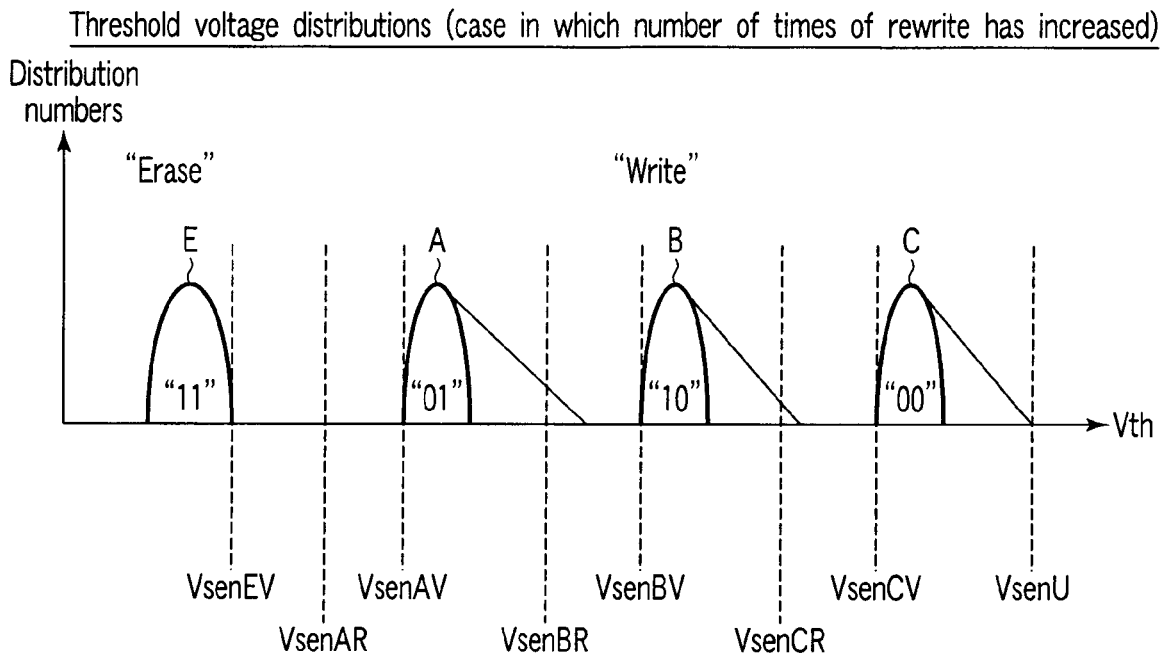
FIG. 26 shows threshold voltage distributions in a case where the number of times of rewrite has increased.

For example, FIG. 26 shows threshold voltage distributions in the case where the number of times of rewrite has increased. As shown in FIG. 26, if the number of times of rewrite increases, the data write in the memory cell MT becomes easier, and the upper bottoms of the threshold voltage distributions of "01(A)" to "00(C)" exceed discrimination level voltages VsenBR to VsenU. As a result, the number of defective cells increases.

Figure 27:
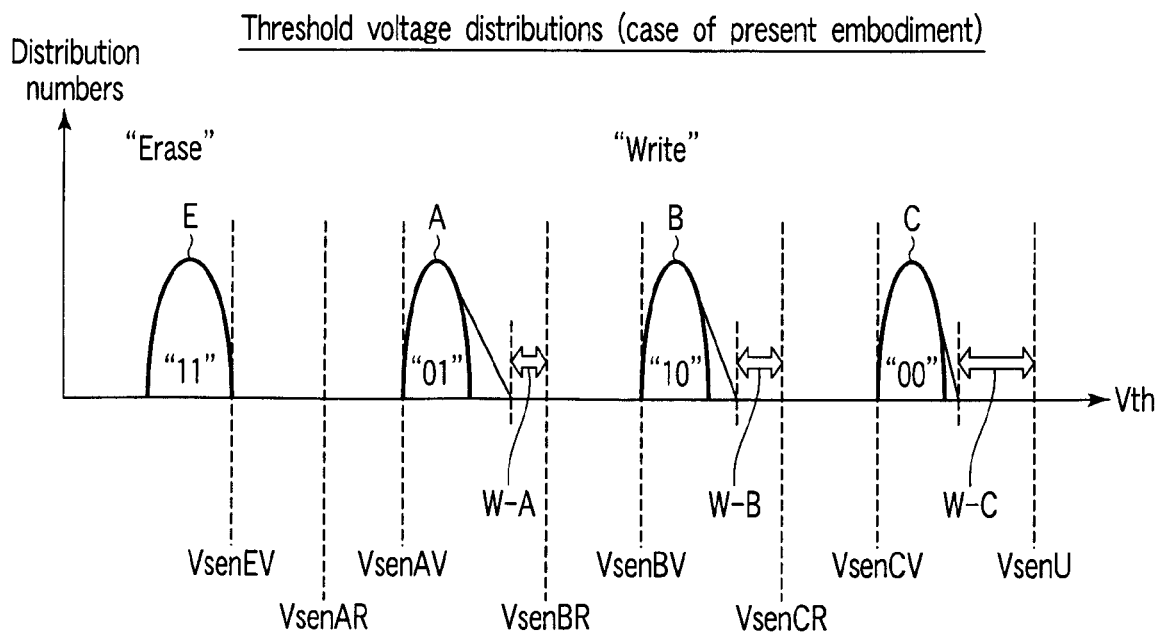
FIG. 27 shows threshold voltage distributions in a case where the number of times of rewrite has increased in the third embodiment.

However, as shown in FIG. 27, for example, in the present embodiment, even if the number of times of rewrite increases, the control circuit 14 can execute a control to prevent the upper bottoms of the threshold voltage distributions of "01(A)" to "00(C)" from exceeding the discrimination level voltages VsenBR to VsenU.

In this case, shift amounts W-A, W-B and W-C of the threshold voltage distributions of "01(A)" to "00(C)" can be varied on the basis of the deterioration information β1, β2, or Vpgm_shiftX that is substituted in the function g1, g2, or by the definition equation (※1), (※2) itself of the function f1, f2 or the definition equation (※※1), (※※2) of the function g1, g2. Therefore, the optimal shift amounts can be selected in accordance with the deterioration state of the threshold voltage distributions "01(A)" to "00(C)".

In the above description of the multilevel NAND flash memory of the third embodiment, the memory circuit 15 stores a plurality of reference pulse numbers NspgmX, reference voltages VpgmiX and voltage correction amounts Vpigmi_shfitX. However, the invention is not limited to this example. It should be noted that even in the case where a single reference pulse number NspgmX, etc., which are parameters, are stored, the above embodiment is applicable if a arithmetic circuits 55 are provided, and this example is included in the scope of the present invention.

The ratio of occupation of the error correcting code in the MLC area (about 60% in this embodiment) is set to be greater than the ratio of occupation of the error correcting code 15-3 in the redundant area 15-2 of the SLC area in FIG. 3 (about 20% in FIG. 3). Thus, in this embodiment, the ratio of the error correcting code area in the MLC area is about three times greater than the ratio of the error correcting code area in the SLC area.

In the above description, the memory circuit 15 is provided in association with each block (Block) by way of example. However, the memory circuit 15 may be provided in association with each page. In this case, the write operation, etc. can advantageously be performed in accordance with a more detailed variation state of the characteristics of the memory cell MT in each page.

Additional advantages and modifications will readily occur to those skilled in the art. Therefore, the invention in its broader aspects is not limited to the specific details and representative embodiments shown and described herein.

Accordingly, various modifications may be made without departing from the spirit or scope of the general inventive concept as defined by the appended claims and their equivalents.

What is claimed is:

1. A semiconductor memory device, comprising:
    a memory cell array;
    a voltage generating circuit;
    a memory circuit which stores a reference pulse number of an advance-write voltage of the memory cell array and a parameter; and
    a control circuit which controls, when a pulse number of the advance-write voltage that is deterioration information of the memory cell is less than the reference pulse number of the advance-write voltage, the voltage generating circuit in a manner to decrease at least one of an initial value of a write voltage and a step-up width of the write voltage in accordance with the parameter,
    wherein the control circuit controls the voltage generating circuit by:
    writing for obtaining the pulse number of the advance-write voltage;
    counting and storing the pulse number; and
    feeding back the counted pulse number.

2. The device according to claim 1, further comprising:
    a plurality of parameter registers in which the reference pulse number of the advance-write voltage and the parameter, which are read out from the memory circuit, are set.

3. The device according to claim 1, further comprising:
    a plurality of cache memories into which the reference pulse number of the advance-write voltage and the parameter are read out batchwise from the memory circuit.

4. The device according to claim 1, wherein the control circuit controls, when the pulse number of the advance-write voltage is less than the reference pulse number of the advance-write voltage, the voltage generating circuit in a manner to increase a program verify level in accordance with the parameter.

5. The device according to claim 1, further comprising:
    an arithmetic circuit which determines the parameter of a write operation on the basis of the reference pulse number.

6. The device according to claim 5, wherein the arithmetic circuit comprises a deterioration information detection circuit which detects deterioration information on the basis of the reference pulse number and a write pulse number.

7. The device according to claim 6, wherein the memory circuit further stores a reference voltage and a voltage correction amount, and
    the arithmetic circuit further comprises a shift amount determination circuit which determines a shift amount of the initial value of the write voltage on the basis of the deterioration information, the reference voltage and the voltage correction amount.

8. The device according to claim 5, wherein the memory circuit further stores a reference pulse number which determines whether or not to shift the step-up width, and
    the arithmetic circuit further comprises a deterioration information detection circuit which detects deterioration information on the basis of the reference pulse number which determines whether or not to shift the step-up width, and the write pulse number.

9. The device according to claim 8, wherein the memory circuit further stores a reference voltage of the step-up width and a voltage correction amount of the step-up width, and the arithmetic circuit further comprises a shift amount determination circuit which determines a shift amount of the step-up width of the write voltage on the basis of the deterioration information, the reference voltages of the step-up width and the voltage correction amounts of the step-up width.

10. A semiconductor memory device capable of storing multi-bit data in one memory cell, comprising:
- a memory cell array in which the memory cell is disposed;
- a voltage generating circuit;
- a memory circuit which stores a reference pulse number of an advance-write voltage of the memory cell array and a parameter; and
- a control circuit which controls, when a pulse number of the advance-write voltage that is deterioration information of the memory cell is less than the reference pulse number of the advance-write voltage, the voltage generating circuit in a manner to decrease at least one of an initial value of a write voltage and a step-up width of the write voltage in accordance with the parameter,
- wherein the control circuit controls the voltage generating circuit by:
- writing for obtaining the pulse number of the advance-write voltage;
- counting and storing the pulse number; and
- feeding back the counted pulse number.

11. The device according to claim 10, further comprising:
a plurality of parameter registers in which the reference pulse number of the advance-write voltage and the parameter, which are read out from the memory circuit, are set.

12. The device according to claim 10, further comprising:
a plurality of cache memories into which the reference pulse number of the advance-write voltage and the parameter are read out batchwise from the memory circuit.

13. The device according to claim 10, wherein the control circuit controls, when the pulse number of the advance-write voltage is less than the reference pulse number of the advance-write voltage, the voltage generating circuit in a manner to increase a program verify level in accordance with the parameter.

14. The device according to claim 10, further comprising:
an arithmetic circuit which determines the parameter of a write operation on the basis of the reference pulse number.

15. The device according to claim 14, wherein the memory circuit further stores a reference voltage and a voltage correction amount, and
the arithmetic circuit comprises:
- a first deterioration information detection circuit which detects first deterioration information on the basis of the reference pulse number and a write pulse number; and
- a first shift amount determination circuit which determines a shift amount of the initial value of the write voltage on the basis of the first deterioration information, the reference voltage and the voltage correction amount.

16. The device according to claim 15, wherein the memory circuit further stores a reference pulse number which determines whether or not to shift the step-up width, a reference voltage of the step-up width and a voltage correction amount of the step-up width, and
the arithmetic circuit further comprises a second deterioration information detection circuit which detects second deterioration information on the basis of the reference pulse number which determines whether or not to shift the step-up width, and the write pulse number; and
a second shift amount determination circuit which determines a shift amount of the step-up width of the write voltage on the basis of the second deterioration information, the reference voltages of the step-up width and the voltage correction amounts of the step-up width.

17. A control method of a semiconductor memory device including a memory cell array, a voltage generating circuit, a memory circuit which stores a reference pulse number of an advance-write voltage of the memory cell array and a parameter, and a control circuit which controls the voltage generating circuit, the method comprising:
- counting a pulse number of pulses of an advance-write voltage that is deterioration information of the memory cell which is applied to the memory cell array after the erase operation, thereby detecting deterioration information of the memory cell array;
- changing, when a write operation is executed in the memory cell array, the parameter in a manner to decrease at least one of an initial value of a write voltage and a step-up width of the write voltage in a case where the counted pulse number of the advance-write voltage is less than the reference pulse number of the advance-write voltage; and
- controlling the voltage generating circuit and executing the write operation by using the changed parameter.

18. The control method according to claim 17, wherein the device is capable of storing multi-bit data in one memory cell which is disposed in the memory cell array, and the device further comprises an arithmetic circuit which determines a parameter of the write operation on the basis of the reference pulse number.

* * * * *